(12) United States Patent
Yamada

(10) Patent No.: US 9,291,679 B2
(45) Date of Patent: Mar. 22, 2016

(54) CELL STATE ESTIMATION DEVICE

(71) Applicant: SANYO Electric Co., Ltd., Osaka (JP)

(72) Inventor: Akihiko Yamada, Osaka (JP)

(73) Assignee: SANYO ELECTRIC CO., LTD., Osaka (JP)

( * ) Notice: Subject to any disclaimer, the term of this patent is extended or adjusted under 35 U.S.C. 154(b) by 36 days.

(21) Appl. No.: 14/476,506

(22) Filed: Sep. 3, 2014

(65) Prior Publication Data

US 2014/0368208 A1 Dec. 18, 2014

Related U.S. Application Data

(63) Continuation of application No. PCT/JP2013/056941, filed on Mar. 13, 2013.

(30) Foreign Application Priority Data

Mar. 21, 2012 (JP) ................ 2012-063686

(51) Int. Cl.
*G01N 27/416* (2006.01)
*G01R 31/36* (2006.01)
*H01M 10/48* (2006.01)
*H02J 7/00* (2006.01)
*H01M 10/0525* (2010.01)

(52) U.S. Cl.
CPC .......... *G01R 31/361* (2013.01); *G01R 31/3624* (2013.01); *G01R 31/3644* (2013.01); *H01M 10/48* (2013.01); *H02J 7/0086* (2013.01); *G01R 31/3662* (2013.01); *H01M 10/0525* (2013.01); *H02J 2007/005* (2013.01)

(58) Field of Classification Search
CPC ............... G01R 19/16542; G01R 31/3648; G01R 31/3658; G01R 31/3682; Y02E 60/12
USPC ........................................... 324/433
See application file for complete search history.

(56) References Cited

U.S. PATENT DOCUMENTS

| 7,317,300 B2 * | 1/2008 | Sada ................. G01R 31/3668 320/104 |
| 7,466,138 B2 * | 12/2008 | Cho .................... B60L 11/1861 320/134 |
| 2005/0073315 A1 * | 4/2005 | Murakami ........... G01R 31/362 324/433 |
| 2007/0145948 A1 * | 6/2007 | Lim .................... B60L 11/1887 320/132 |

(Continued)

FOREIGN PATENT DOCUMENTS

| JP | 2007-178215 | 7/2007 |
| JP | 2008-136330 | 6/2008 |
| JP | 2012-32267 | 2/2012 |

*Primary Examiner* — Arun Williams
(74) *Attorney, Agent, or Firm* — Muncy, Geissler, Olds & Lowe, P.C.

(57) ABSTRACT

After discharging has been stopped, a transient response component of the voltage remaining in the cell unit is calculated as an initial remaining voltage value ($V_{DIFF}$) from the difference between the measured voltage value ($CCV_{OFF}[t_{C1}]$) and the open-circuit voltage value ($OCV_{ON\text{-}EST}[t_{C0}]$). The open-circuit voltage value is thereafter estimated on the basis of the initial remaining voltage value, a predetermined time constant, and the measured voltage value during the interval in which discharge is stopped, with consideration given to the fact that the transient response component attenuates with a predetermined time constant.

9 Claims, 19 Drawing Sheets

(56) References Cited

U.S. PATENT DOCUMENTS

| | | | |
|---|---|---|---|
| 2008/0024137 A1* | 1/2008 | Carlin | G01R 31/3631 324/427 |
| 2008/0122399 A1 | 5/2008 | Nishino et al. | |
| 2011/0316547 A1* | 12/2011 | Liu | G01R 31/362 324/427 |
| 2012/0029851 A1 | 2/2012 | Nakayama et al. | |
| 2014/0225622 A1* | 8/2014 | Kudo | B60L 3/0046 324/433 |
| 2015/0253389 A1* | 9/2015 | Arai | H02J 7/0021 324/427 |

* cited by examiner

| OPEN-CIRCUIT VOLTAGE VALUE | OCV | $OCV_{ON\cdot EST}$ (ESTIMATED VALUE IN ENERGIZING PERIOD) |
|---|---|---|
| | | $OCV_{OFF\cdot EST}$ (ESTIMATED VALUE IN NON-ENERGIZING PERIOD) |
| MEASURED VOLTAGE VALUE | CCV | $CCV_{ON}$ (MEASURED VALUE IN ENERGIZING PERIOD) |
| | | $CCV_{OFF}$ (MEASURED VALUE IN NON-ENERGIZING PERIOD) |
| MEASURED CURRENT VALUE | I | |
| MEASURED TEMPERATURE | T | |

FIG. 5

CELL STATE ESTIMATION DEVICE

CROSS-REFERENCE TO RELATED APPLICATION

The present application is a continuation under 35 U.S.C. §120 of PCT/JP2013/056941, filed on Mar. 13, 2013, which is incorporated herein by reference and which claimed priority to Japanese Patent Application No. 2012-063686 filed on Mar. 21, 2012. The present application likewise claims priority under 35 U.S.C. §119 to Japanese Patent Application No. 2012-063686 filed on Mar. 21, 2012, the entire content of which is also incorporated herein by reference.

TECHNICAL FIELD

The present invention generally relates to a battery state estimation device.

BACKGROUND ART

By measuring a terminal voltage of a battery part when charge/discharge is stopped, an open-circuit voltage of the battery part can be detected. FIG. 21 illustrates an example of an equivalent circuit of a battery part 900 composed of a secondary battery. It can be considered that the battery part 900 is equivalent to a serial connection circuit of an ideal voltage source 901 in which internal resistance is zero and an impedance circuit 902. An output voltage of the voltage source 901 corresponds to the open-circuit voltage. In the impedance circuit 902, not only a resistance component but also a capacitance component is included. Thus, since a voltage corresponding to a stored charge of the capacitance component is added to the terminal voltage for some time after charge or discharge is stopped, the terminal voltage does not accurately indicate the open-circuit voltage. Therefore, in a conventional method $MT_{CNV}$, in order to recognize the open-circuit voltage, the terminal voltage is measured after waiting for the terminal voltage to be sufficiently stabilized after the charge or discharge is stopped (for instance, see Patent Literature 1 below). Though it depends on the structure of the battery part 900, generally an attenuation time constant of the stored charge of the capacitance component inside the impedance circuit 902 is about one hour.

CITATION LIST

Patent Literature

Patent Literature 1: Japanese Patent Laid-Open Publication No. 2007-178215

SUMMARY OF INVENTION

Technical Problem

In the conventional method $MT_{CNV}$, the time needed before recognizing the open-circuit voltage therefore becomes long. When detection of the open-circuit voltage is delayed, processing (SOC calculation processing or the like) and control (schedule control of charge and discharge or the like) to be performed utilizing an open-circuit voltage value are therefore also delayed. Also, in the conventional method $MT_{CNV}$, it is difficult to measure the open-circuit voltage in a use in which charge and discharge are frequently repeated in a short period (a use in which a stop period of charge and discharge is short).

Therefore, it is an advantage of the present invention to provide a battery state estimation device capable of estimating the open-circuit voltage within a short time after charge or discharge is stopped.

Solution to Problem

A battery state estimation device according to the present invention includes: a measured value acquisition unit for acquiring a measured current value which is a measured value of a current flowing to a battery part and a measured voltage value which is a measured value of a terminal voltage of the battery part; a first open-circuit voltage estimation unit for estimating an open-circuit voltage value of the battery part on the basis of the measured voltage value and the measured current value, or estimating the open-circuit voltage value of the battery part on the basis of a remaining capacity of the battery part estimated from an integrated value of the measured current value, in a first period during which charge or discharge of the battery part is performed; and a second open-circuit voltage estimation unit for estimating the open-circuit voltage value of the battery part on the basis of the measured voltage value and an estimated open-circuit voltage value by the first open-circuit voltage estimation unit, in a second period during which the charge and discharge of the battery part are stopped, after the first period.

Advantageous Effect of Invention

According to the present invention, there is provided a battery state estimation device capable of estimating an open-circuit voltage within a short time after charge or discharge is stopped.

BRIEF DESCRIPTION OF DRAWINGS

FIG. 5 is a diagram in which some symbols to be referred to in the present embodiment and corresponding physical quantities.

DESCRIPTION OF EMBODIMENTS

Hereinafter, an example of an embodiment of the present invention will be concretely described with reference to drawings. In individual diagrams to be referred to, the same signs are attached to the same part, and overlapping descriptions related to the same part are omitted as a general rule. Also, in this description, symbols and signs are referred to information, signals, physical quantities, state amounts or members or the like. Names of the information, signals, physical quantities, state amounts or members or the like corresponding to the symbols or the signs are sometimes omitted or abbreviated for simplification of descriptions.

Figure 1:
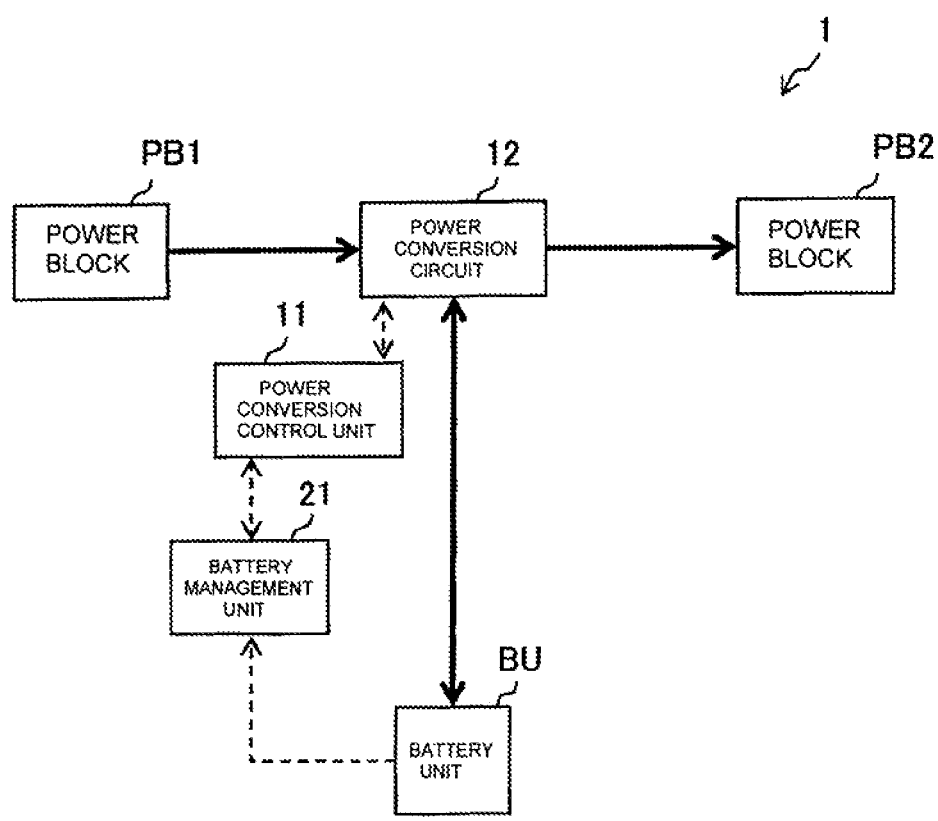
FIG. 1 is a schematic whole configuration diagram of a power system related to an embodiment of the present invention.

FIG. 1 is a schematic whole configuration diagram of a power system 1 related to the embodiment of the present invention. The power system 1 includes a power conversion control unit 11, a power conversion circuit 12, a battery management unit 21 and a battery unit BU, and may further include one or more power blocks for outputting power or receiving input of the power.

In an example in FIG. 1, a power block PB1 which is composed of a solar cell or the like and outputs the power, and a power block PB2 which is composed of a load or the like and receives the input of the power, are connected to the power conversion circuit 12, but one power block may input and output the power bidirectionally to/from the power conversion circuit 12.

Figure 2:
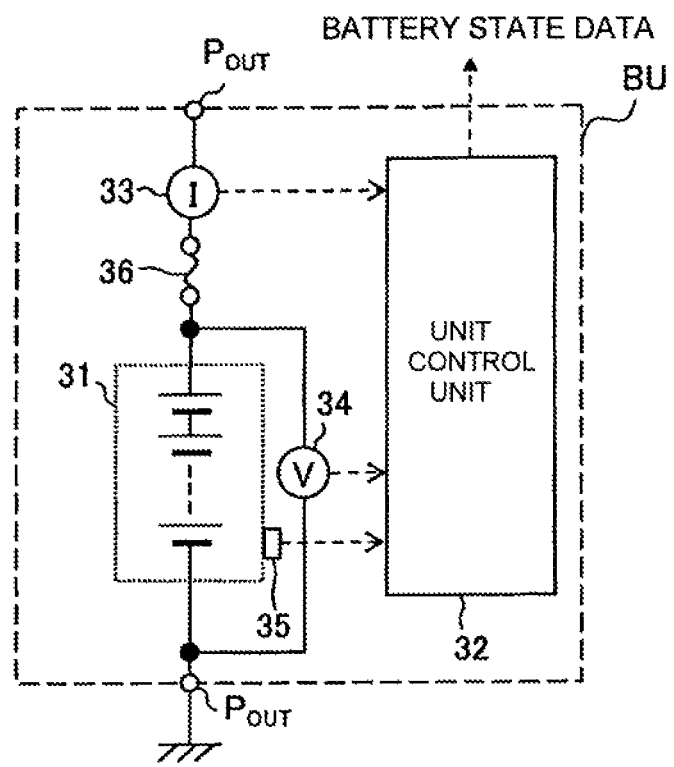
FIG. 2 is an internal configuration diagram of a battery unit.

FIG. 2 is an internal configuration diagram of the battery unit BU. Each battery unit BU is provided with a battery part (battery module) 31 composed of a secondary battery. In the present embodiment, discharge and charge mean the discharge and charge of the battery part 31 unless described in particular. The power conversion circuit 12 is capable of supplying a charge current based on output power of the power block PB1 to the battery part 31 and supplying a discharge current of the battery part 31 to the power block PB2 through power conversion under control of the power conversion control unit 11. The plurality of battery units BUs may be connected to the power conversion circuit 12.

The battery unit BU includes individual parts that will be referred to by numerals 31-36. The battery part 31 is composed of one or more secondary batteries. The secondary battery forming the battery part 31 is a secondary battery of an arbitrary kind, and is, for instance, a lithium-ion battery or a nickel hydrogen battery. The number of secondary batteries forming the battery part 31 may be one, but in the present embodiment, it is assumed that the battery part 31 is composed of the plurality of secondary batteries connected in series. However, some or all of the secondary batteries included in the battery part 31 may be a plurality of secondary batteries connected in parallel. In the battery part 31, among the plurality of secondary batteries connected in series, the positive pole of the secondary battery positioned on the highest potential side and a negative pole of the secondary battery positioned on the lowest potential side are connected to a pair of power input/output terminals $P_{OUT}$s in the battery unit BU, and the charge and discharge of the battery part 31 are performed through the pair of power input/output terminals $P_{OUT}$s.

Between the battery part 31 and the pair of power input/output terminals $P_{OUT}$s, a current sensor 33 which measures a value of a current flowing to the battery part 31 (called a battery current value, hereinafter) and a fuse 36 of a self control protector or the like are interposed in series. A voltage sensor 34 measures a value of a voltage of the battery part 31 (called a battery voltage value, hereinafter). The battery voltage value is a terminal voltage value of the battery part 31, that is, a potential difference between the positive pole of the secondary battery positioned on the highest potential side and the negative pole of the secondary battery positioned on the lowest potential side in the battery part 31. A temperature sensor 35 measures a temperature of the battery part 31 (called a battery temperature, hereinafter). The battery temperature is, for instance, a surface temperature of a pack packing the plurality of secondary batteries inside the battery part 31, or a temperature at a specific part inside the battery part 31.

The battery current value, the battery voltage value and the battery temperature measured by the sensors 33, 34 and 35 are sent to a unit control unit 32. The unit control unit 32 is capable of generating battery state data based on the battery current value, the battery voltage value and the battery temperature that are measured, and outputting the battery state data to the battery management unit 21 connected to the battery unit BU. The battery management unit 21 is capable of outputting signals related to permission or inhibition of the charge or the discharge to the power conversion control unit 11 according to the battery state data, and when needed, turning off a breaker that may be provided between the power conversion circuit 12 and the battery unit BU.

Figure 3:
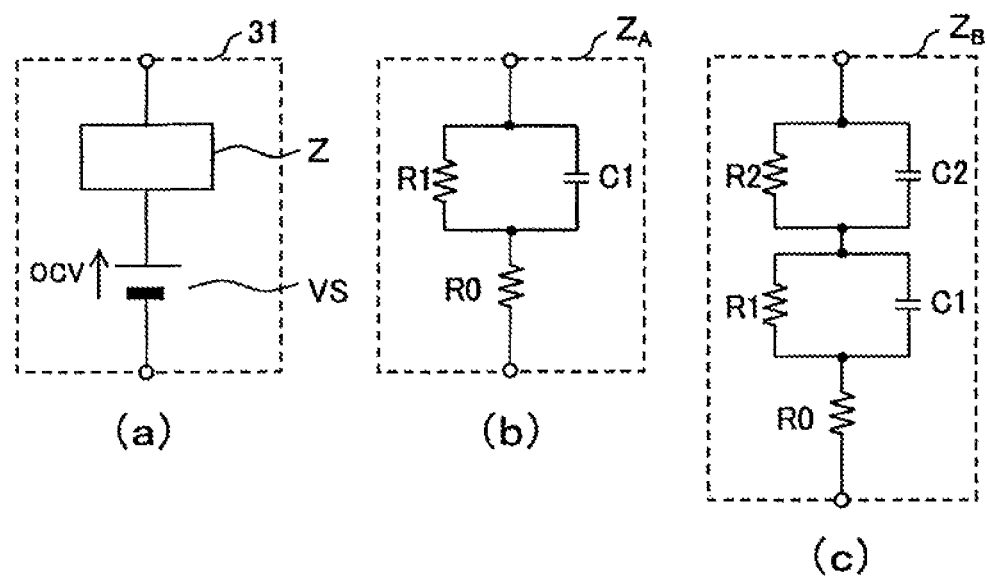
FIG. 3 is a diagram (a) illustrating an equivalent circuit of a battery part and diagrams (b) and (c) illustrating first and second examples of an impedance circuit inside the battery part.

FIG. 3(a) illustrates an equivalent circuit inside the battery part 31. The equivalent circuit inside the battery part 31 can be considered to be a serial connection circuit of a voltage source VS which outputs a voltage OCV and in which internal resistance is zero, and an impedance circuit Z including a resistance component and a capacitance component. A circuit $Z_A$ in FIG. 3(b) is a first example of an internal circuit of the impedance circuit Z, and a circuit $Z_B$ in FIG. 3(c) is a second example of the internal circuit of the impedance circuit Z. The circuit $Z_A$ is a circuit in which a resistor R0 and a parallel connection circuit of a resistor R1 and a capacitor C1 are connected in series. The circuit $Z_B$ is a circuit in which the resistor R0, the parallel connection circuit of the resistor R1 and the capacitor C1, and a parallel connection circuit of a resistor R2 and a capacitor C2 are connected in series. The parallel connection circuit of the resistors and the capacitors like those parallel connection circuits is also called an RC circuit. Hereinafter, unless described in particular, the circuit $Z_B$ is considered to be the impedance circuit Z.

The unit control unit 32 or the battery management unit 21 includes an open-circuit voltage estimation device 50 in FIG.

4, which estimates an open-circuit voltage value of the battery part 31. The unit control unit 32 and the battery management unit 21 may cooperate to form the open-circuit voltage estimation device 50. The open-circuit voltage value of the battery part 31 is an output voltage value OCV of the voltage source VS. Also, the terminal voltage value of the battery part 31 measured in the voltage sensor 34 is called a measured voltage value and is also indicated by a symbol CCV. When a voltage drop in the impedance circuit Z is zero, CCV=OCV. Terms and symbols are described in FIG. 5. The battery current value measured in the current sensor 33 is called a measured current value and is also indicated by a symbol I. The battery temperature measured in the temperature sensor 35 is called a measured temperature and is also indicated by a symbol T. Also, in this description, in order to refer to a certain voltage and to the value of the voltage, a common symbol is used (the same also applies for the current or the like). For instance, sometimes, when describing the open-circuit voltage, it is described as the open-circuit voltage OCV, while the actual value of the open-circuit voltage is described as the open-circuit voltage value OCV.

Figure 6:
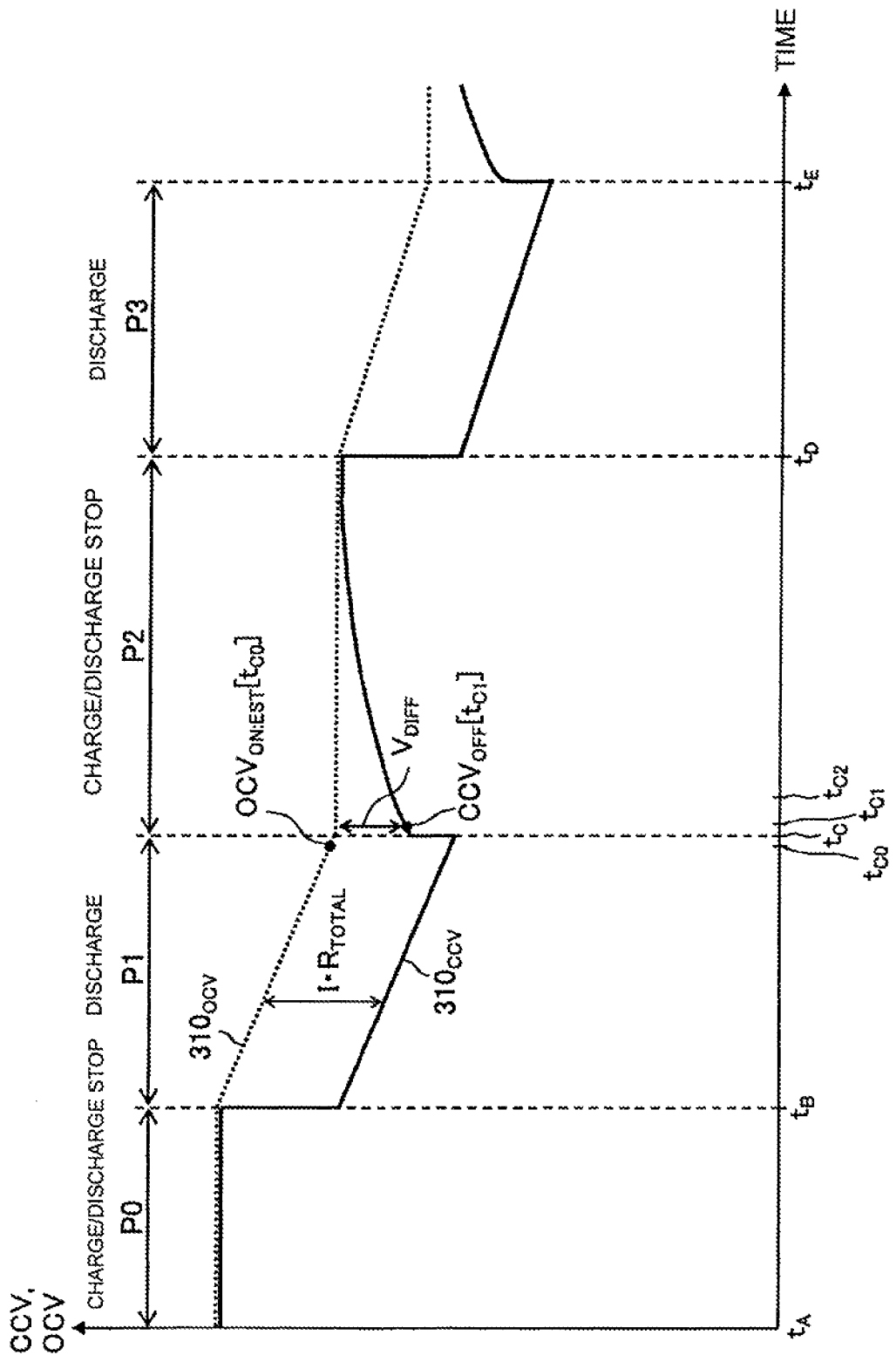
FIG. 6 is a diagram illustrating change over time of a measured voltage and an open-circuit voltage of the battery part.

An open-circuit voltage estimation method will be described with reference to FIG. 6. It is assumed that the charge and discharge of the battery part 31 are not performed in a period P0 from the time $t_A$ to the time $t_E$, the discharge of the battery part 31 is performed in a period P1 from the time $t_B$ to the time $t_C$ thereafter, the charge and discharge of the battery part 31 are stopped in a period P2 from the time $t_C$ to the time $t_D$ thereafter, and the discharge of the battery part 31 is performed in a period P3 from the time $t_D$ to the time $t_E$ thereafter. In FIG. 6, a solid line waveform $310_{CCV}$ formed of a curve and a polygonal line indicates time transition of the measured voltage CCV, and a broken line waveform $310_{OCV}$ formed of a polygonal line indicates time transition of the open-circuit voltage OCV. In all or a part of the period P0 and a latter part of the period P2, the measured voltage CCV and the open-circuit voltage OCV completely or roughly coincide. However, in FIG. 6, for the convenience of illustration, some parts of the waveforms $310_{CCV}$ and $310_{OCV}$ are slightly shifted in a vertical direction.

Figure 4:
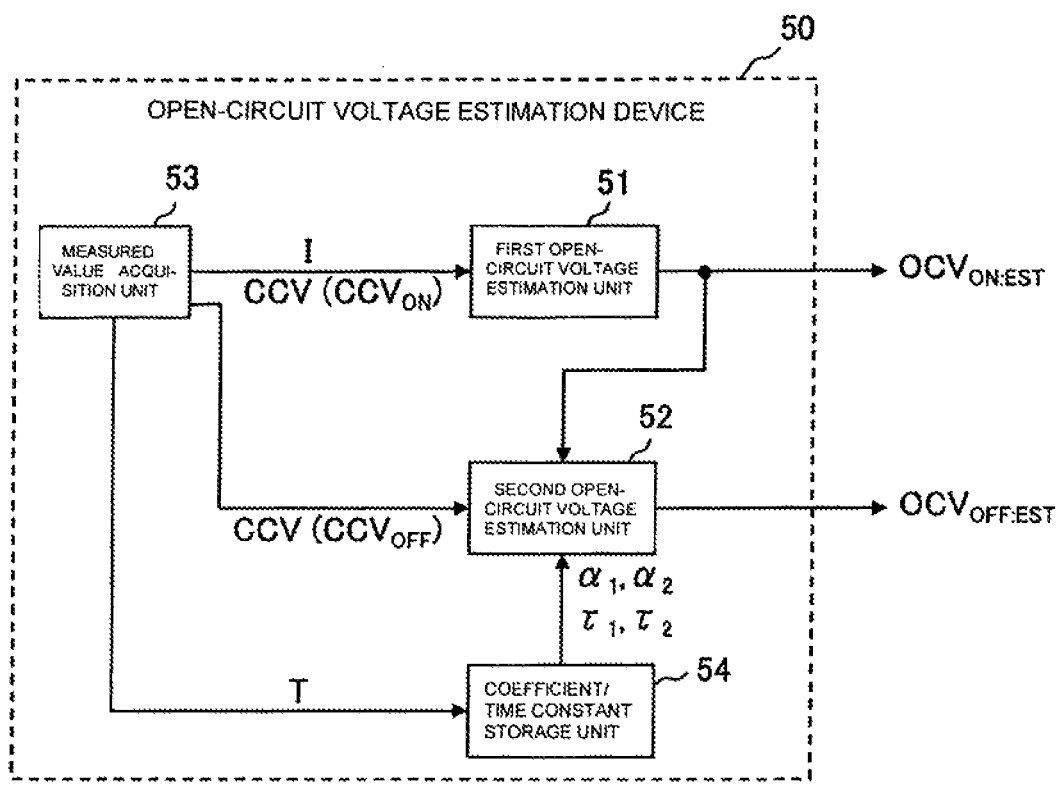
FIG. 4 is an internal block diagram of an open-circuit voltage estimation device related to the present embodiment.

As illustrated in FIG. 4, the open-circuit voltage estimation device 50 includes individual parts to be referred to by signs 51-54. A measured value acquisition unit 53 cyclically acquires the measured current value I, the measured voltage value CCV and the measured temperature T by sampling output signals of the sensors 33, 34 and 35 in a predetermined sampling cycle.

A first open-circuit voltage estimation unit 51 (may be abbreviated to estimation unit 51, hereinafter) estimates the open-circuit voltage value OCV on the basis of the measured voltage value CCV and the measured current value I in an energizing period. The energizing period indicates a discharge period during which the discharge of the battery part 31 is performed or a charge period during which the charge of the battery part 31 is performed, and a time at which an absolute value of the current value I is larger than a threshold $I_{TH}$ belongs to the energizing period. The $I_{TH}$ is a predetermined value equal to or larger than zero. The measured voltage value CCV in the energizing period is indicated by a symbol $CCV_{ON}$ in particular, and the open-circuit voltage value OCV estimated by the estimation unit 51 in the energizing period is indicated by a symbol $OCV_{ON:EST}$ in particular (see FIG. 5). Further, I, CCV, $CCV_{ON}$, OCV and $OCV_{ON:EST}$ at the time t are respectively noted as I[t], CCV[t], $CCV_{ON}$[t], OCV[t] and $OCV_{ON:EST}$[t]. When the time t is in the energizing period, the estimation unit 51 obtains the open-circuit voltage value $OCV_{ON:EST}$[t] according to the following expression (1). Here, $R_{TOTAL}$ is an internal resistance value of the battery part 31 indicated by an expression (2), and a value of $R_{TOTAL}$ can be predetermined in the estimation unit 51. The estimation unit 51 may change the value of $R_{TOTAL}$ to be used to derive the open-circuit voltage value $OCV_{ON:EST}$ according to the measured temperature T. Also, it is assumed that polarity of the measured current value I is positive when the current flowing to the battery part 31 is a charge current, and the polarity of the measured current value I is negative when the current flowing to the battery part 31 is a discharge current.

[Expression 1]

$$OCV_{ON:EST}[t]=CCV_{ON}[t]-I[t]\cdot R_{TOTAL} \quad (1)$$

$$R_{TOTAL}=R0+R1+R2 \quad (2)$$

Alternatively, the estimation unit 51 may integrate the measured current value I in the energizing period, estimate a present remaining capacity of the battery part 31 on the basis of the integrated value, and estimate the open-circuit voltage value $OCV_{ON:EST}$ on the basis of data of the estimated remaining capacity. In this case, it may be considered that the estimation unit 51 includes a current integration unit 61 and an SOC calculation unit 101 (see FIG. 13) described later, or a current integration unit and an SOC calculation unit (not shown in the diagram) that are equivalent to the current integration unit 61 and the SOC calculation unit 101 described later, and the integrated value and the data of the estimated remaining capacity may be the same as an integrated value ΣI and estimated remaining capacity data $SOC_I$ described later. Based on the $SOC_I$ at the point in time of the start of an integration target period, the integrated value ΣI in the target period, and a full charge capacity of the battery part 31, the estimation unit 51 is capable of obtaining the $SOC_I$ at the point in time of the end of the target period (the full charge capacity can be known to the estimation unit 51). As is well known, the open-circuit voltage value depends on SOC (state of charge) which is a form of remaining capacity data. Therefore, the estimation unit 51 is capable of converting the data of the estimated remaining capacity (that is, $SOC_I$) to the open-circuit voltage value $OCV_{ON:EST}$ by using a relational expression or a lookup table defining a relationship between the open-circuit voltage value OCV and the SOC.

A second open-circuit voltage estimation unit 52 (may be abbreviated to estimation unit 52, hereinafter) estimates the open-circuit voltage value OCV on the basis of the measured voltage value CCV, and the estimated open-circuit voltage value $OCV_{ON:EST}$ by the estimation unit 51 in a non-energizing period. The non-energizing period indicates a period during which the discharge and charge of the battery part 31 are not performed, and a time at which the absolute value of the current value I is equal to or smaller than the threshold $I_{TH}$ is in the non-energizing period. The measured voltage value CCV in the non-energizing period is indicated by a symbol $CCV_{OFF}$ in particular, and the open-circuit voltage value OCV estimated by the estimation unit 52 in the non-energizing period is indicated by a symbol $OCV_{OFF:EST}$ in particular (see FIG. 5). Further, the $CCV_{OFF}$ and $OCV_{OFF:EST}$ at the time t are respectively denoted as $CCV_{OFF}$[t] and $OCV_{OFF:EST}$[t].

With reference to FIG. 4 and FIG. 6, an estimation method of the estimation unit 52 will be described paying attention to a discharge period P1 and a non-energizing period P2. The estimation unit 52 is provided with the estimated open-circuit voltage value $OCV_{ON:EST}$[$t_{C0}$] at the time $t_{C0}$ from the estimation unit 51, and is also provided with the measured voltage value $CCV_{OFF}[t_{C1}]$ at the time $t_{C1}$ from the acquisition unit 53. The time $t_{C0}$ is the time immediately before discharge stop, that is in the discharge period P1, and the time predetermined time before the time $t_C$ can be set as the time $t_{C0}$ for instance. Alternatively, for instance, of the acquisition time of the measured voltage value $CCV_{ON}$ and the measured current value I by the acquisition unit 53, the time that is before the time $t_C$ and is closest to the time $t_C$ may be the time $t_{C0}$. The time $t_{C1}$ is a time that is in the non-energizing period P2, and the time the predetermined time after the time $t_C$ can be set as the time $t_{C1}$ for instance. Alternatively, for instance, of the acquisition time of the measured voltage value $CCV_{OFF}$ and the measured current value I by the acquisition unit 53, the time that is after the time $t_C$ and is closest to the time $t_C$ may be the time $t_{C1}$.

On the basis of the measured voltage value $CCV_{OFF}[t_{C1}]$ and the estimated open-circuit voltage value $OCV_{ON:EST}[t_{C0}]$, the estimation unit 52 derives a transient response component $V_{DIFF}$ of the voltage remaining inside the battery part 31 at the time (specific time) $t_{C1}$, according to the following expression (3). Here, the transient response component of the voltage is a voltage component other than a DC component due to an RC circuit inside the battery part 31, and corresponds to a sum of the voltage due to a stored charge of the capacitor C1 (that is, an interpolar voltage of the capacitor C1) and the voltage due to a stored charge of the capacitor C2 (that is, an interpolar voltage of the capacitor C2). Thus, in a non-energizing section, the transient response component of the voltage remaining inside the battery part 31 decreases as time passes. The $V_{DIFF}$ derived according to the expression (3) is the transient response component of the voltage at the time $t_{C1}$, and it is called an initial remaining voltage. Since the voltage drop of the resistor R0 becomes zero after the discharge stop, as illustrated in FIG. 6, the terminal voltage ($CCV_{OFF}$) instantly increases accordingly from the time $t_C$, but the initial remaining voltage $V_{DIFF}$ remains inside the battery part 31 at the time $t_{C1}$.

[Expression 2]

$$V_{DIFF} = |OCV_{ON:EST}[t_{C1}] - CCV_{OFF}[t_{C1}]| \quad (3)$$

The initial remaining voltage $V_{DIFF}$ corresponds to a composite voltage of a voltage $V_{DIFF1}$ added to the parallel connection circuit of the resistor R1 and the capacitor C1 and a voltage $V_{DIFF2}$ added to the parallel connection circuit of the resistor R2 and the capacitor C2. Therefore, the estimation unit 52 is capable of obtaining the voltage values $V_{DIFF1}$ and $V_{DIFF2}$ according to the following expressions (4) and (5). Coefficients $\alpha_1$ and $\alpha_2$ to be used to derive the voltage values $V_{DIFF1}$ and $V_{DIFF2}$ are supplied from a coefficient/time constant storage unit 54 to the estimation unit 52 (see FIG. 4). The coefficients $\alpha_1$ and $\alpha_2$ are coefficients based on the following expressions (6) and (7), and values predetermined through experimentation or the like may be stored in the storage unit 54 as the values of the coefficients $\alpha_1$ and $\alpha_2$.

[Expression 3]

$$V_{DIFF1} = \alpha_1 \cdot V_{DIFF} \quad (4)$$

$$V_{DIFF2} = \alpha_2 \cdot V_{DIFF} \quad (5)$$

$$\alpha_1 = R1/(R1+R2) \quad (6)$$

$$\alpha_2 = R2/(R1+R2) \quad (7)$$

Figure 7:
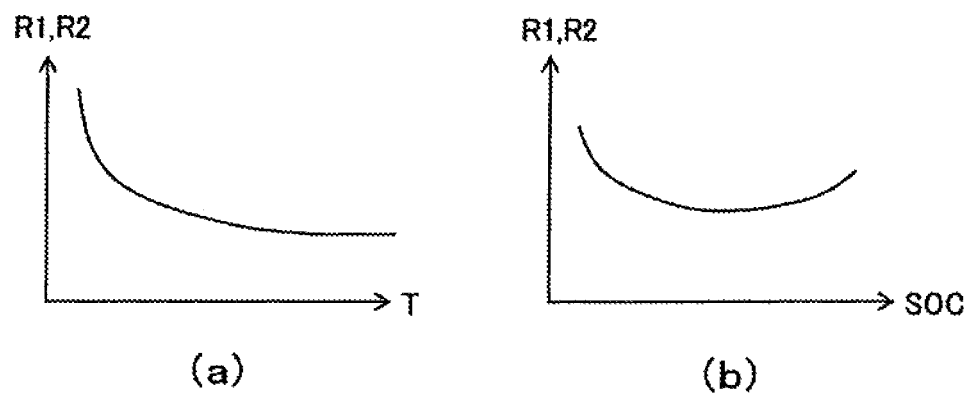
FIG. 7 is a diagram illustrating that a resistance component inside the battery part depends on temperature and SOC.

Though the values of the coefficients $\alpha_1$ and $\alpha_2$ may be fixed values, since the values of the resistors R1 and R2 change depending on the battery temperature and the SOC (state of charge) of the battery part 31 as illustrated in FIGS. 7(a) and (b), the values of the coefficients $\alpha_1$ and $\alpha_2$ may be changed according to the measured temperature T, and the values of the coefficients $\alpha_1$ and $\alpha_2$ may be also changed according to the SOC of the battery part 31. Actually, for instance, a lookup table in which the measured temperature T is input and the coefficients $\alpha_1$ and $\alpha_2$ are output can be provided in the storage unit 54 (the output of the lookup table can depend further on the SOC). Also, since the values of the resistors R1 and R2 can change due to aging effect as well, the values of the coefficients $\alpha_1$ and $\alpha_2$ may be changed according to SOH (state of health) of the battery part 31 or the like.

In the non-energizing period P2, the voltage $V_{DIFF1}$ attenuates with a time constant $\tau_1$ that depends on the values of the resistor R1 and the capacitor C1, and the voltage $V_{DIFF2}$ attenuates with a time constant $\tau_2$ that depends on the values of the resistor R2 and the capacitor C2. Therefore, after calculating the initial remaining voltage $V_{DIFF}$ (after calculating the voltages $V_{DIFF1}$ and $V_{DIFF2}$) the estimation unit 52 can obtain a residual voltage $V_{TRANS}[t]$ at the arbitrary time t in the non-energizing period P2 according to the following expression (8). A symbol "t" on the right side of the expression (8) indicates elapsed time from a time at which the transient response component of $(V_{DIFF1}+V_{DIFF2})$ remains inside the battery part 31, that is, the elapsed time from the time $t_{C1}$. The remaining voltage $V_{TRANS}[t]$ is the transient response component of the voltage remaining inside the battery part 31 at the time t in the non-energizing period P2. Therefore, on the basis of the measured voltage value $CCV_{OFF}[t]$ and the remaining voltage value $V_{TRANS}[t]$ at the time t in the non-energizing period P2, the estimation unit 52 can obtain the open-circuit voltage value $OCV_{OFF:EST}$ according to the following expression (9). The $OCV_{OFF:EST}[t]$ indicates the open-circuit voltage value estimated by the estimation unit 52 at the time t in the non-energizing period P2.

[Expression 4]

$$V_{TRANS}[t] = V_{DIFF1} \cdot \exp(-t/\tau_1) + V_{DIFF2} \cdot \exp(-t/\tau_2) \quad (8)$$

$$OCV_{OFF:EST}[t] = CCV_{OFF}[t] + V_{TRANS}[t] \quad (9)$$

Figure 8:
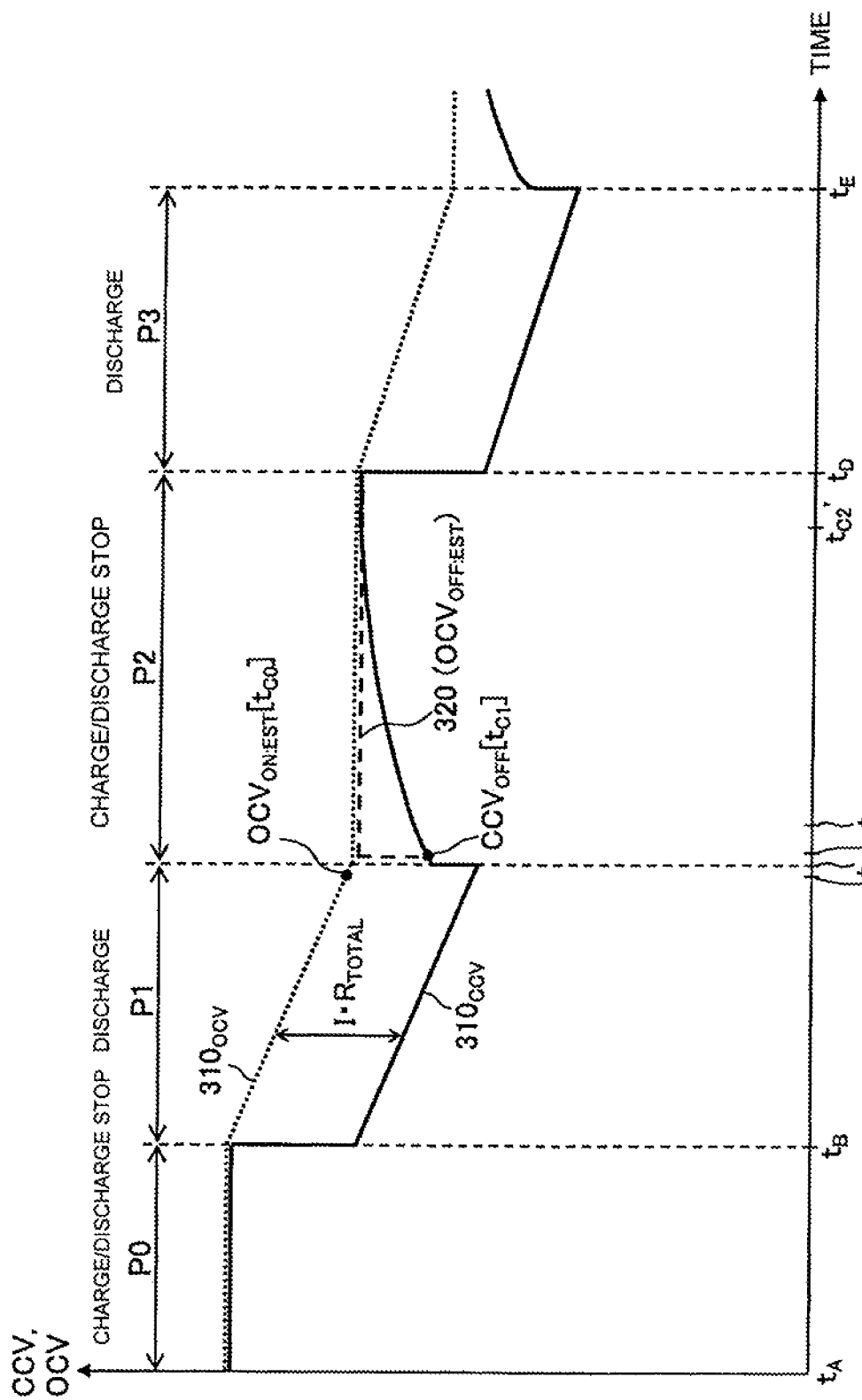
FIG. 8 is a diagram for which a waveform of an estimated open-circuit voltage is added to FIG. 6.

For instance, at the time $t_{C2}$ which is in the non-energizing period P2 and is after the time $t_{C1}$, the estimation unit 52 can obtain the remaining voltage value $V_{TRANS}[t_{C2}]$ by substituting a time difference between the times $t_{C1}$ and $t_{C2}$ for "t" on the right side of the expression (8), and obtain the open-circuit voltage value $OCV_{OFF:EST}[t_{C2}]$ by substituting the measured voltage value $CCV_{OFF}[t_{C2}]$ and the remaining voltage value $V_{TRANS}[t_{C2}]$ at the time $t_{C2}$ for "$CCV_{OFF}[t]$" and "$V_{TRANS}[t]$" on the right side of the expression (9). FIG. 8 is a diagram for which a broken line waveform 320 that is a waveform of the estimated open-circuit voltage $OCV_{OFF:EST}$ in the non-energizing period P2 is added to FIG. 6. For the convenience, in FIG. 8, the time $t_{C2}$' after the time $t_{C2}$, to be referred to later, is also indicated.

The time constants $\tau_1$ and $\tau_2$ are supplied from the coefficient/time constant storage unit 54 to the estimation unit 52 (see FIG. 4). Values predetermined through experimentation or the like may be stored in the storage unit 54 as the values of the time constants $\tau_1$ and $\tau_2$. Though the values of the time constants $\tau_1$ and $\tau_2$ may be fixed values, similarly to the coefficients $\alpha_1$ and $\alpha_2$, the values of time constants $\tau_1$ and $\tau_2$ may be changed according to the measured temperature T, and the values of the time constants $\tau_1$ and $\tau_2$ may also be changed according to the SOC of the battery part 31. Actually, for instance, a lookup table in which the measured temperature T is input and the time constants $\tau_1$ and $\tau_2$ are output can be provided in the storage unit 54 (the output of the lookup table can depend further on the SOC). Further, the values of the time constants $\tau_1$ and $\tau_2$ may be changed according to the SOH (state of health) of the battery part 31 or the like.

In the case of estimating the open-circuit voltage OCV in the non-energizing period, it is necessary to measure the terminal voltage after waiting for the terminal voltage to be sufficiently stabilized (after waiting for the time $t_{C2}'$ in FIG. 8 for instance) in the conventional method $MT_{CNV}$, but according to the present embodiment, the open-circuit voltage can be accurately estimated without waiting for the stabilization of the terminal voltage after the energizing period is switched to the non-energizing period. That is, according to the present embodiment, the open-circuit voltage can be accurately estimated in a shorter time than in the conventional method $MT_{CNV}$ after the energizing period is switched to the non-energizing period. Shortening of the time needed for estimation makes it possible to improve responsiveness of various kinds of processing (SOC calculation processing or the like) and control (schedule control of charge and discharge or the like) utilizing the estimated open-circuit voltage value, and it is extremely useful. Also, while the open-circuit voltage cannot be measured in a usage situation in which charge and discharge are frequently repeated in a short period (a use in which a length of the non-energizing period is short) in the conventional method $MT_{CNV}$, the open-circuit voltage can be estimated even under such usage conditions with the estimation method by the present embodiment. As a result, compared to the conventional method $MT_{CNV}$, opportunities of estimating the open-circuit voltage can be increased. Increase of estimation opportunities leads to improvement of reliability of the various kinds of processing and control utilizing the estimated open-circuit voltage value.

The estimation method of the open-circuit voltage has been described mainly assuming that the energizing period is the discharge period. However, the open-circuit voltage can be estimated similarly to the above even in the case that the energizing period is the charge period. However, voltage polarity of the RC circuit becomes opposite for the discharge and the charge. Therefore, in the case that the period P1 is the charge period, in the non-energizing period P2, the estimation unit 52 uses the following expression (9a) instead of the expression (9) to obtain the open-circuit voltage $OCV_{OFF:EST}[t]$

[Expression 5]

$$OCV_{OFF:EST}[t] = CCV_{OFF}[t] - V_{TRANS}[t] \quad (9a)$$

Also, open-circuit voltage estimation processing of the estimation unit 52 may be performed assuming that the impedance circuit Z inside the battery part 31 is the circuit $Z_A$ (see FIGS. 3(a) and (b)). In this case, the need to compute the voltages $V_{DIFF1}$ and $V_{DIFF2}$ using the coefficients $\alpha_1$ and $\alpha_2$ is eliminated, and the estimation unit 52 uses the following expression (8a) instead of the expression (8) to obtain the remaining voltage $V_{TRANS}[t]$ in the non-energizing period P2. Though it depends on characteristics of the battery part 31, $\tau_1$ is a time constant of 10 minutes to several hours, and it is the main cause of prolongation of the remaining voltage attenuation of the RC circuit. However, since an RC circuit having a time constant of several seconds to several minutes is often present in the battery part 31 as well, it is preferable to assume the circuit $Z_B$ in FIG. 3(c) as the impedance circuit Z and estimate the remaining voltage $V_{TRANS}[t]$ using the expression (8), and thus improvement in estimation accuracy is expected. The remaining voltage $V_{TRANS}[t]$ may be estimated assuming that there are three or more RC circuits inside the battery part 31, aiming at further estimation accuracy improvement.

[Expression 6]

$$V_{TRANS}[t] = V_{DIFF} \cdot \exp(-t/\tau_1) \quad (8a)$$

Hereinafter, some application examples for the open-circuit voltage estimation device 50 will be described. All the above-described matters apply to each of the following first-fourth application examples as they are not inconsistent. Also, the matters described in any one application example among the first-fourth application examples can be applied to the other application examples as they are not inconsistent.

First Application Example

Figure 9:
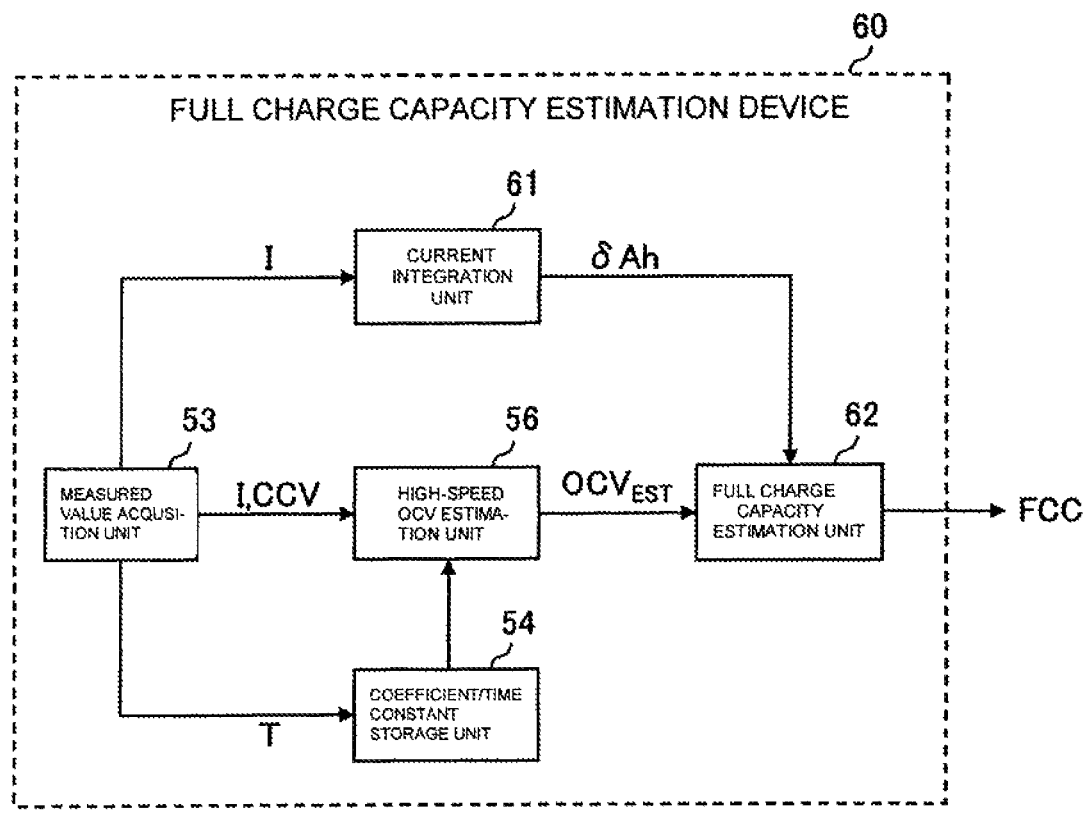
FIG. 9 is an internal block diagram of a full charge capacity estimation device related to a first application example.

The first application example will be described. FIG. 9 is an internal block diagram of a full charge capacity estimation device 60 related to the first application example, and the full charge capacity estimation device 60 includes respective parts to be referred to by signs 53, 54, 56, 61 and 62. A high-speed OCV estimation unit 56 is a part composed of the estimation units 51 and 52 in FIG. 4, and the open-circuit voltage estimation device 50 in FIG. 4 is formed by the acquisition unit 53, the storage unit 54, and the estimation unit 56. Hereinafter, the open-circuit voltage $OCV_{OFF:EST}$ estimated by the estimation unit 52 inside the estimation unit 56 is indicated as $OCV_{EST}$, and the estimated open-circuit voltage $OCV_{EST}$ at the time t is indicated by a symbol $OCV_{EST}[t]$ in particular.

Figure 10:
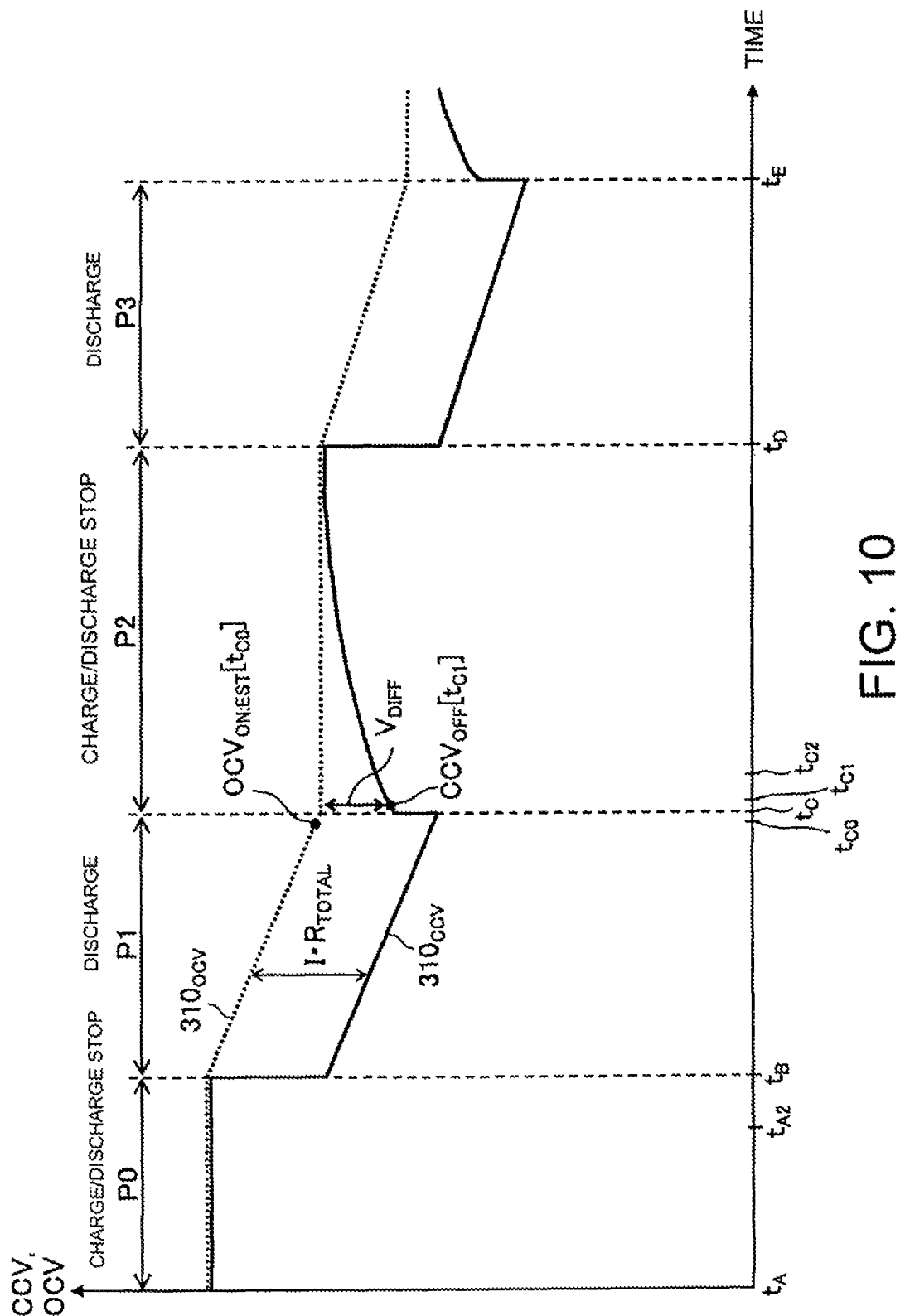
FIG. 10 is a diagram illustrating the change over time of the measured voltage and the open-circuit voltage of the battery part, to be referred to in the first application example.
Figure 11:
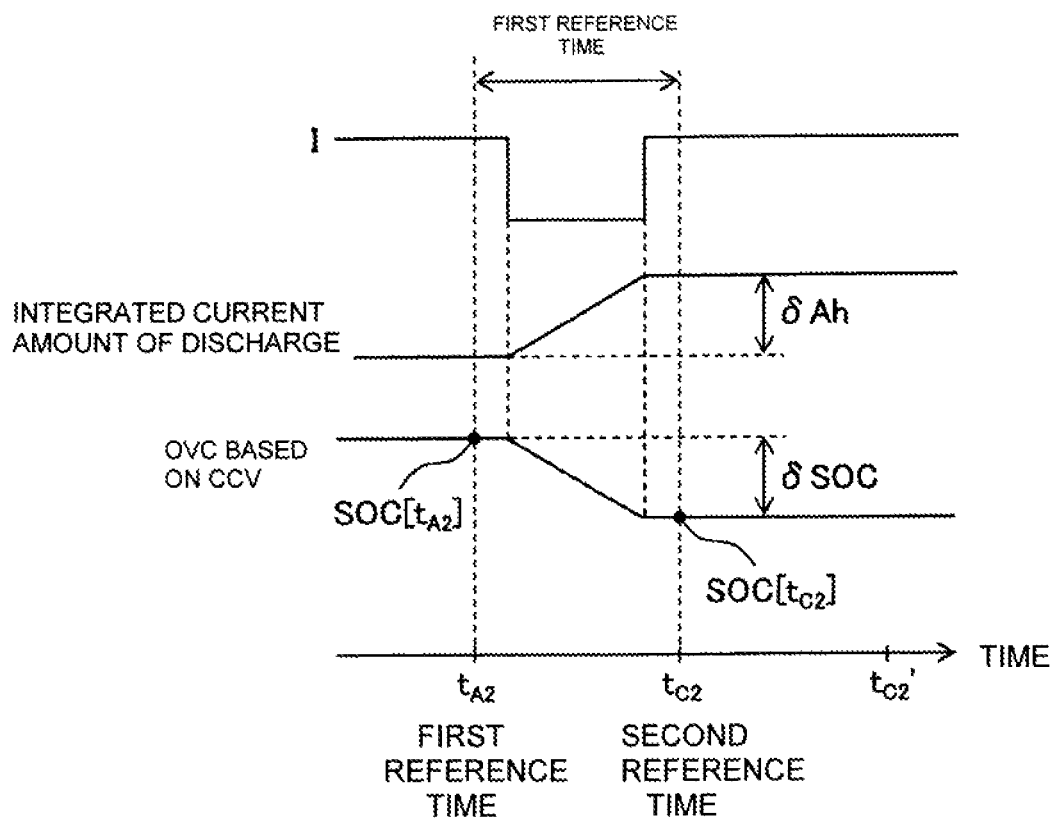
FIG. 11 is a diagram illustrating the change over time of a current, an integrated current amount and the SOC assumed in the first application example.

By integrating the measured current value I supplied from the acquisition unit 53 in an arbitrary target period, the current integration unit 61 obtains a total current amount (the total amount of the current) which has flowed to the battery part 31 in the target period. The total current amount has the same meaning as the total electricity amount, and a unit of the total current amount is "mA·h (milliampere·hour)" or "A·h (ampere·hour)". Here, it is assumed that the target period is a period from a first reference time to a second reference time, and the total current amount which has flowed to the battery part 31 in the target period is indicated by a symbol δAh. Also, the first and second reference times are both times in the non-energizing period. Here, for actualization of the description, FIG. 10 and FIG. 11 are referred to, and it is assumed that the time $t_{A2}$ in the non-energizing period P0 is the first reference time and the time $t_{C2}$ in the non-energizing period P2 is the second reference time. In this case, the current integration unit (current amount derivation unit) 61 derives the total current amount δAh which has flowed to the battery part 31 between the times $t_{A2}$ and $t_{C2}$ from an integration result of the measured current value I between the times $t_{A2}$ and $t_{C2}$. Only the discharge is performed between the first and second times under the above mentioned condition, however, that the charge may be performed or the discharge and the charge may be performed between the first and second times.

A full charge capacity estimation unit 62 obtains the SOC of the battery part 31 at the times $t_{A2}$ and $t_{C2}$, that is, $SOC[t_{A2}]$ and $SOC[t_{C2}]$, on the basis of the open-circuit voltage value OCV at the times $t_{A2}$ and $t_{C2}$ (see FIG. 11). The SOC (state of charge) of the battery part 31 is, as is well known, a ratio of the remaining capacity of the battery part 31 to the full charge capacity of the battery part 31, and depends on the open-circuit voltage. Thus, the estimation unit 62 is capable of obtaining the SOC at the arbitrary time on the basis of the open-circuit voltage value OCV at that time by using the relational expression or the lookup table defining the relationship between the open-circuit voltage value OCV and the SOC. It can be considered that an SOC calculation unit (not shown in the diagram) that is equivalent to an SOC calculation unit 102 described later (see FIG. 13) is provided inside the estimation unit 62.

Here, the open-circuit voltage value OCV at the time $t_{C2}$ to be used to derive the $SOC[t_{C2}]$ is the estimated open-circuit voltage value $OCV_{EST}[t_{C2}]$ by the high-speed OCV estimation unit 56. However, the open-circuit voltage value OCV at the time $t_{A2}$ to be used to derive the $SOC[t_{A2}]$ may be the estimated open-circuit voltage value $OCV_{EST}[t_{A2}]$ from the high-speed OCV estimation unit 56, or may be the measured voltage value $CCV[t_{A2}]$ itself when the remaining voltage of the RC circuit has sufficiently attenuated at the time $t_{A2}$. A storage unit (not shown in the diagram) for holding the SOC $[t_{A2}]$ until the $SOC[t_{C2}]$ is obtained can be provided in the estimation unit 62.

The estimation unit 62 obtains a change amount δSOC of the SOC between the times $t_{A2}$ and $t_{C2}$ according to an expression "δSOC=$SOC[t_{A2}]$–$SOC[t_{C2}]$" (see FIG. 11), and further, estimates a full charge capacity FCC of the battery part 31 by dividing the total current amount δAh by the change amount δSOC. That is, the estimation unit 62 estimates the full charge capacity FCC according to an expression "FCC=|δAh/δSOC|" (however, when δAh and δSOC are limited to be positive, absolute value computation is not needed).

As described above, in the full charge capacity estimation device 60, the full charge capacity can be estimated using the estimated open-circuit voltage value of the high-speed OCV estimation unit 56 (that is, the estimated open-circuit voltage value of the estimation unit 52 in FIG. 4). Therefore, compared to the case of estimating the full charge capacity using the conventional method $MT_{CNV}$, it is possible to substantially shorten the time needed for estimating the full charge capacity. This is because in the case of using the conventional method $MT_{CNV}$, it is difficult to acquire the second open-circuit voltage value required for calculating the δSOC until the remaining voltage is sufficiently attenuated by the RC circuit (for instance, until the time $t_{C2}$' in FIG. 8 and FIG. 11). In addition, differently from the conventional method $MT_{CNV}$, according to the first application example, the full charge capacity can be estimated even in a usage situation where the charge and the discharge are frequently repeated in a short period (a usage situation where the length of the non-energizing period is short). As a result, the opportunities of estimating the full charge capacity can be increased compared to the conventional method $MT_{CNV}$. Increase in the estimation opportunities leads to improvement of the reliability of the various kinds of processing (SOC calculation processing and degradation degree determination processing or the like) utilizing the estimated value of the full charge capacity.

Figure 12:
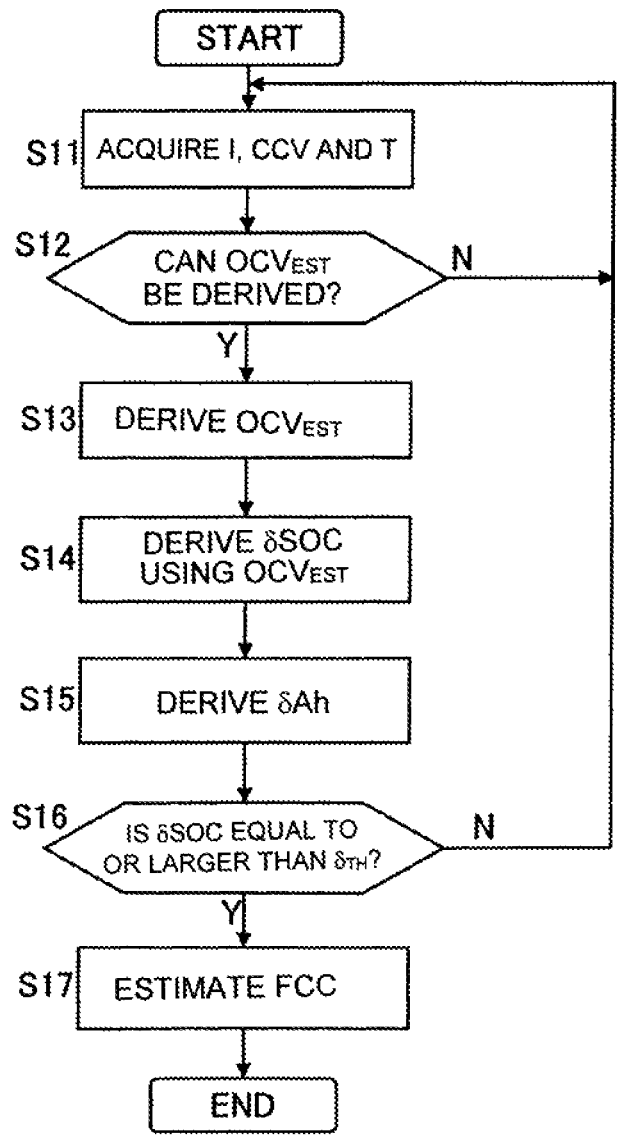
FIG. 12 is an operation flowchart of the full charge capacity estimation device related to the first application example.

With reference to FIG. 12, an operation procedure of the full charge capacity estimation device 60 will be described. The device 60 is capable of repeatedly executing a series of processing starting from step S11 in a fixed cycle (a cycle of 1 millisecond, for instance). In step S11, the measured values I, CCV and T are acquired. In following step S12, the device 60 determines whether or not it is possible to derive the $OCV_{EST}$. Specifically, for instance, when the absolute value of the current value I is equal to or smaller than the threshold $I_{TH}$, it is determined that it is possible to derive the $OCV_{EST}$ and the processing in steps S13-S15 is performed, and when the absolute value of the current value I is larger than the threshold $I_{TH}$, the processing returns to step S11. The $OCV_{EST}$ is derived and the δSOC is derived using the $OCV_{EST}$ in steps S13 and S14, and the δAh is derived in step S15. In following step S16, the estimation unit 62 compares the δSOC with a predetermined threshold $δ_{TH}$ (for instance, $δ_{TH}$=0.3). When the δSOC is equal to or larger than the predetermined threshold $δ_{TH}$, the estimation unit 62 estimates the full charge capacity FCC on the basis of the δAh and the δSOC in step S17. Otherwise, the processing returns from step S16 to step S11. As will be understood from the expression for deriving the FCC, since the FCC is obtained by division with the δSOC as a denominator, when the δSOC is too small, estimation accuracy of the FCC is not sufficiently increased. Therefore, branching processing of step S16 is provided. When the non-energizing period continues, the processing of steps S11-S16 or the processing of steps S11-S17 can be repeatedly executed, and the $OCV_{EST}$ or the like can be updated therein.

Second Application Example

Figure 13:
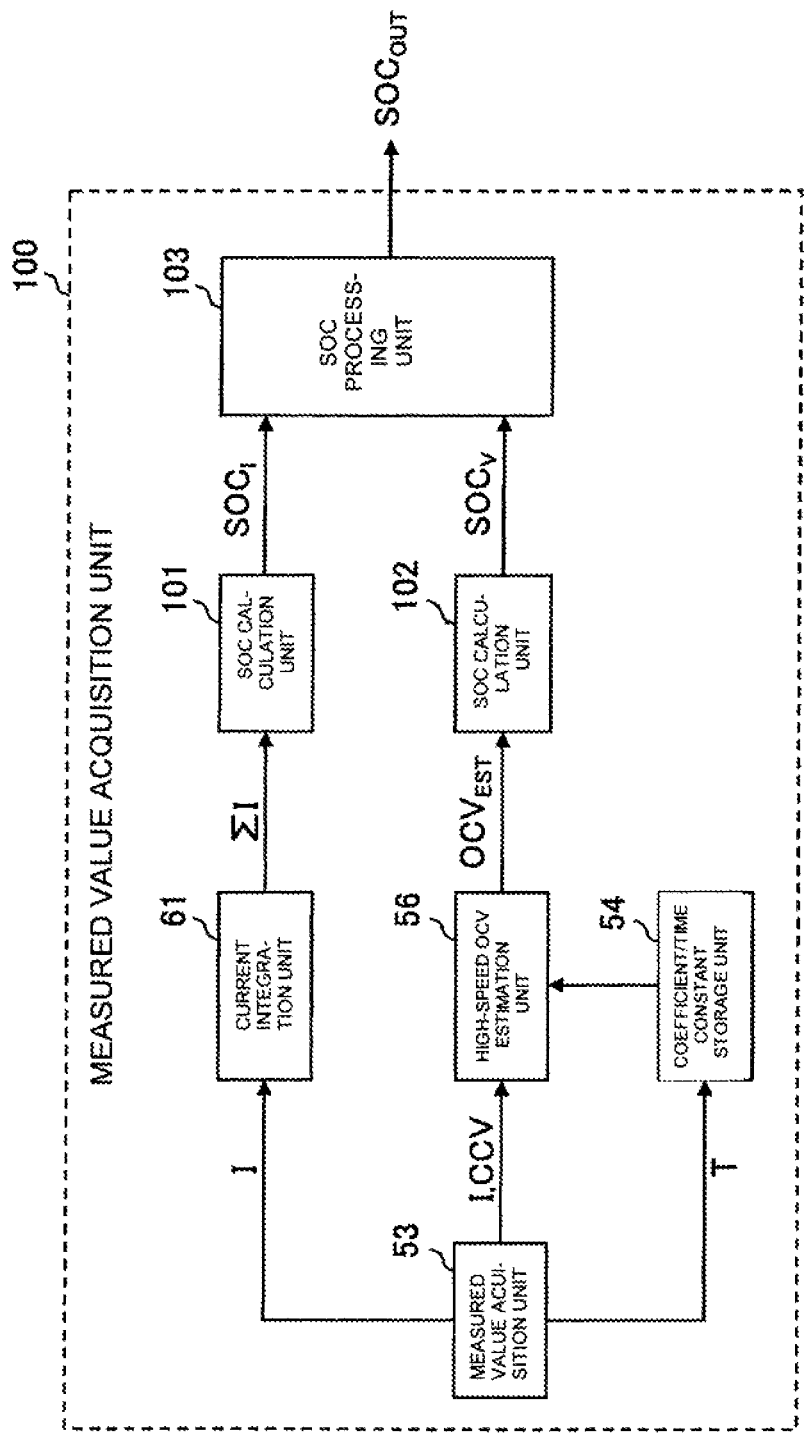
FIG. 13 is an internal block diagram of a remaining capacity estimation device related to a second application example.

A second application example will be described. FIG. 13 is an internal block diagram of a remaining capacity estimation device 100 related to the second application example, and the remaining capacity estimation device 100 includes individual parts to be referred to by numerals 53, 54, 56, 61 and 101-103. The device 100 in FIG. 13 may further include the full charge capacity estimation unit 62 in FIG. 9. Functions and configurations of the acquisition unit 53, the storage unit 54 and the estimation unit 56 are as described above.

The function of the current integration unit 61 is also as described above. That is, by integrating the measured current value I supplied from the acquisition unit 53 in an arbitrary target period, the current integration unit 61 derives and outputs the integrated value ΣI of the measured current value I in the target period (that is, the total current amount which has flowed to the battery part 31 in the target period).

The SOC calculation unit 101 derives and outputs estimated remaining capacity data $SOC_I$ by estimating the present remaining capacity of the battery part 31 on the basis of the output value ΣI of the current integration unit 61. The estimated remaining capacity data $SOC_I$ indicates the value of the SOC of the battery part 31 estimated by the SOC calculation unit 101. Here, it is assumed that the full charge capacity of the battery part 31 is known to the SOC calculation unit 101. When the device 100 in FIG. 13 includes the full charge capacity estimation unit 62 in FIG. 9, the SOC calculation unit 101 may obtain the $SOC_I$ by using the estimated full charge capacity FCC from the estimation unit 62. The SOC calculation unit 101 can obtain the $SOC_I$ at the point in time of the end of the target period on the basis of the $SOC_I$ at the point in time of the start of the target period, the integrated value ΣI for the target period, and the full charge capacity of the battery part 31.

An SOC calculation unit 102 derives and outputs estimated remaining capacity data $SOC_V$ by estimating the remaining capacity of the battery part 31 on the basis of the open-circuit voltage value $OCV_{EST}$ (that is, the estimated open-circuit voltage value of the estimation unit 52 in FIG. 4) estimated and derived by the estimation unit 56 in the non-energizing period. The estimated remaining capacity data $SOC_V$ indicates the value of the SOC of the battery part 31 estimated by the SOC calculation unit 102. The SOC calculation unit 102 is capable of converting the open-circuit voltage value $OCV_{EST}$ to the $SOC_V$ by using the relational expression or the lookup table defining the relationship between the open-circuit voltage value OCV and the SOC.

Although reliability of SOC estimation using the open-circuit voltage value is generally high, it is difficult to highly accurately obtain the open-circuit voltage value in the energizing period, and a result, the SOC estimation through current integration is utilized in the energizing period. However, since various error factors (for instance, accumulation of errors that may occur in each current measurement and a deviation from a true value of the full charge capacity to be used in the estimation) affect the SOC estimation through the current integration, the SOC estimation based on the open-circuit voltage value is advantageous in terms of estimation accuracy.

Accordingly, an SOC processing unit 103 corrects the estimated remaining capacity data $SOC_I$ using the estimated remaining capacity data $SOC_V$, or generates output data $SOC_{OUT}$ of the remaining capacity on the basis of the estimated remaining capacity data $SOC_I$ and $SOC_V$. When the SOC processing unit 103 is formed so as to be able to correct the data $SOC_I$, the SOC processing unit 103 determines necessity of correction, outputs the data $SOC_I$ corrected based on the data $SOC_V$ as the output data $SOC_{OUT}$ when the correction is needed, and outputs the data $SOC_I$ independent of the data $SOC_V$ as the output data $SOC_{OUT}$ as it is when the correction is not needed. Therefore, correction of the data $SOC_I$ using the data $SOC_V$ is also one form of generating the output data $SOC_{OUT}$ on the basis of the data $SOC_I$ and $SOC_V$. The output data $SOC_{OUT}$ is provided for the part which refers to the SOC of the battery part 31.

For instance, the output data $SOC_{OUT}$ is displayed by a display unit not shown in the diagram. Alternatively, for instance, the charge and the discharge are controlled according to the output data $SOC_{OUT}$ in the power system 1 (see FIG. 1). Hereinafter, the data $SOC_I$, $SOC_V$ and $SOC_{OUT}$ at the time t are respectively indicated by symbols $SOC_I[t]$, $SOC_V[t]$ and $SOC_{OUT}[t]$.

According to the second application example, an SOC estimation error due to the current integration can be corrected using an SOC estimated value based on the open-circuit voltage value. Since the open-circuit voltage value to be used in the correction is provided by the high-speed OCV estimation unit 56, the correction is possible even in a usage situation where the charge and the discharge are frequently repeated in a short time (a usage situation where the length of the non-energizing period is short). As a result, correction opportunities can be increased, and the increase of the correction opportunities leads to the improvement in the reliability of the output SOC ($SOC_{OUT}$).

The simplest correction method that the SOC processing unit 103 can execute is a method of replacing the data $SOC_I$ with the data $SOC_V$ at the point in time at which the data $SOC_V$ is obtained. That is, for instance, when the $SOC_V$ of 25% is obtained when the $SOC_I$ is 30%, the SOC processing unit 103 may instantaneously correct the $SOC_I$ to be 25%. An additional description will be given for this method. In this method, the SOC processing unit 103 is capable of setting the data $SOC_I$ to the output data $SOC_{OUT}$ and outputting it not only in the energizing period but also in the non-energizing period. Then, for instance, when the estimated open-circuit voltage value $SOC_{EST}[t_{C2}]$ is obtained by the estimation unit 56 at the time $t_{C2}$, and the data $SOC_V[t_{C2}]$ based on the open-circuit voltage value $OCV_{EST}[t_{C2}]$ is obtained by the SOC calculation unit 102, the SOC processing unit 103 can substitute $SOC_V[t_{C2}]$ for $SOC_I[t_{C2}]$. Thereafter, the SOC calculation unit 101 may restart the estimation of the remaining capacity (derivation of the $SOC_I$) using the integrated value $\Sigma I$ with $SOC_I[t_{C2}]$ after the substitution (that is, $SOC_V[t_{C2}]$) as a reference.

Third Application Example

A third application example will be described. In the above-described method of instantaneously substituting the value of $SOC_V$ for $SOC_I$, $SOC_{OUT}$ suddenly changes. It is preferable to avoid such a sudden change if possible since it may give a feeling of incompatibility or the like to a person or a system referring to $SOC_{OUT}$. In the third application example and a fourth application example described later, technology for suppressing such a sudden change will be described.

Figure 14:
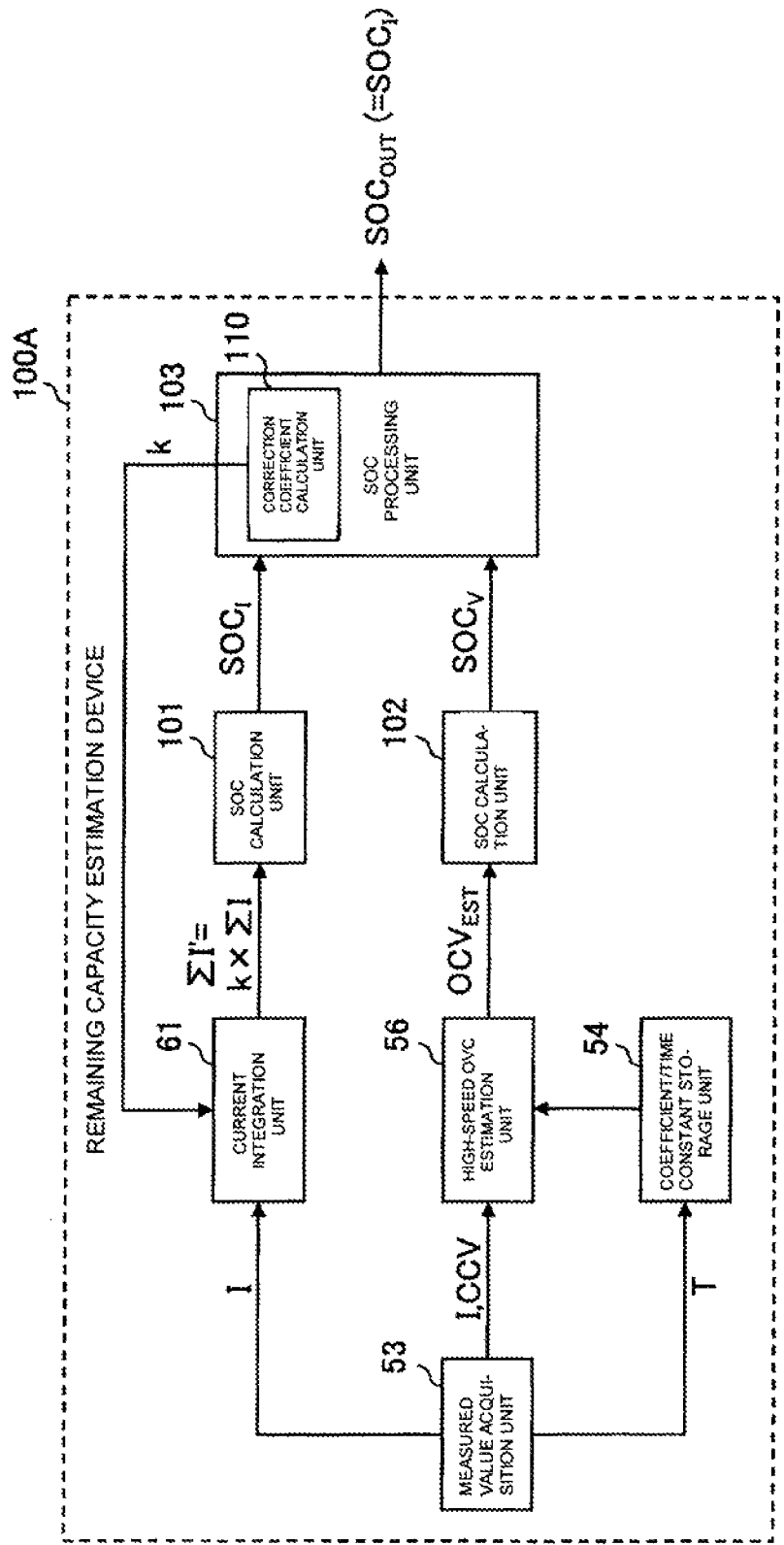
FIG. 14 is an internal block diagram of the remaining capacity estimation device related to a third application example.

FIG. 14 is an internal block diagram of a remaining capacity estimation device 100A which is one form of the remaining capacity estimation device 100. The remaining capacity estimation device 100A has the same configuration as the remaining capacity estimation device 100. However, the remaining capacity estimation device 100A includes a correction coefficient calculation unit 110 which calculates a correction coefficient k inside the SOC processing unit 103, and achieves the correction of the data $SOC_I$ using the correction coefficient k. The SOC processing unit 103 in the device 100A is capable of outputting the data $SOC_I$ as the output data $SOC_{OUT}$ at all times. The correction coefficient calculation unit 110 sets 1 as the correction coefficient k when the correction of the data $SOC_I$ is not needed, but sets a positive value other than 1 as the correction coefficient k when the correction is needed.

Figure 15:
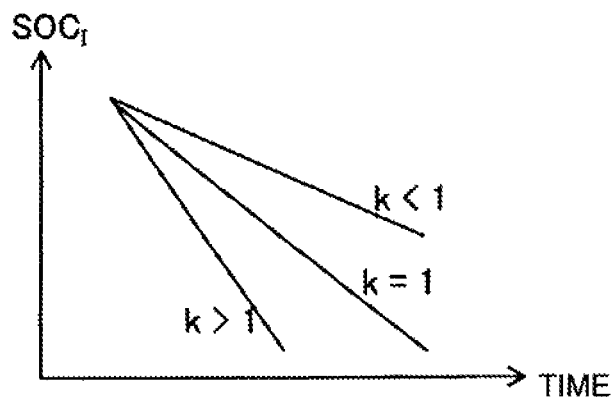
FIG. 15 is a diagram illustrating that change of the SOC depends on a correction coefficient (k), related to the third application example.

The current integration unit 61 in the device 100A integrates the measured current value I successively obtained in a predetermined sampling cycle in an arbitrary target period, multiplies the obtained integrated value $\Sigma I$ with the correction coefficient k and then outputs it to the SOC calculation unit 101. That is, the current integration unit 61 in the device 100A outputs a value $\Sigma I' (=k \times \Sigma I)$ to the SOC calculation unit 101 instead of the value $\Sigma I$. By estimating the present remaining capacity of the battery part 31 on the basis of the output value $\Sigma I'$ of the current integration unit 61, the SOC calculation unit 101 derives and outputs the estimated remaining capacity data $SOC_I$. That is, the SOC calculation unit 101 derives the data $SOC_I$ assuming that the total current amount (the total amount of the current) which has flowed to the battery part 31 in the target period is $\Sigma I'$. Therefore, as illustrated in FIG. 15, under a certain charge or discharge condition, when k>1, a change amount of the data $SOC_I$ becomes large compared to the state of k=1, and when k<1, the change amount of the data $SOC_I$ becomes small compared to the state of k=1.

Figure 16:
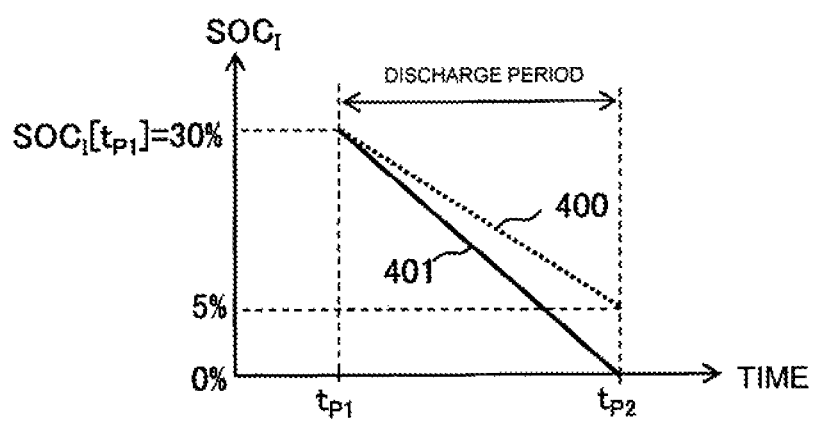
FIG. 16 is a diagram for describing a correction method of an estimated value of the SOC related to the third application example.

An initial value of the correction coefficient k is 1. With reference to FIG. 16, a setting method example of the correction coefficient k will be described. It is assumed that the derivation of the $SOC_I$ is continuously executed in the state of k=1, and at the time $t_{P1}$ (for instance, $t_{P1}=t_{C2}$) in the non-energizing period, the $SOC_I[t_{P1}]$ of 30% is derived in the calculation unit 101 and the $SOC_V[t_{P1}]$ of 25% is derived in the calculation unit 102. The $SOC_V[t_{P1}]$ can be considered as the true value of the SOC at the time $t_{P1}$. Then, if k=1 is maintained in the discharge period after the time $t_{P1}$, at the time $t_{P2}$ after the time $t_{P1}$, it becomes $SOC_I[t_{P2}]=5\%$ even though the true value of the SOC is zero (however, it is assumed that there is no estimation error of the SOC due to the current integration between the times $t_{P1}$ and $t_{P2}$). In FIG. 16, a broken line segment 400 indicates the time transition of the $SOC_I$ between the times $t_{P1}$ and $t_{P2}$ when k is maintained at 1.

The correction coefficient calculation unit 110 sets the correction coefficient k such that, when the $SOC_I[t_{P1}]$ of 30% and the $SOC_V[t_{P1}]$ of 25% are obtained at the time $t_{P1}$, $SOC_I$ changes along a solid line 401 in FIG. 16, that is $SOC_I$ changes from 30% to 0% from the time $t_{P1}$ to the time $t_{P2}$, in the discharge period that may come after the time $t_{P1}$. While the time when "$SOC_I[t_{P1}]>SOC_V[t_{P1}]$" is exemplified, it is the same for the time when "$SOC_I[t_{P1}]<SOC_V[t_{P1}]$", and also in the case that the charge is performed after the time $t_{P1}$, the correction coefficient k can be set according to the same point.

Generally, setting processing of the correction coefficient k is performed as follows. When $SOC_V[t_{P1}]$ is obtained at the time $t_{P1}$ in the non-energizing period, the correction coefficient calculation unit 110 compares $SOC_I[t_{P1}]$ and $SOC_V[t_{P1}]$, sets 1 as the correction coefficient k when $SOC_I[t_{P1}]$ coincides with $SOC_V[t_{P1}]$, and sets a value other than 1 as the correction coefficient k when $SOC_I[t_{P1}]$ does not coincide with $SOC_V[t_{P1}]$. The current integration unit 61 derives the integrated value $\Sigma I'$ using the latest correction coefficient k set in the calculation unit 110. The correction coefficient calculation unit 110 confirms the polarity of the measured current value I after the time $t_{P1}$, sets the correction coefficient k according to an equation for the discharge "$k=SOC_I[t_{P1}]/SOC_V[t_{P1}]$" when the current flowing to the battery part 31 after the time $t_{P1}$ is a discharge current, and sets the correction coefficient k according to an equation for the charge "$k=(1-SOC_I[t_{P1}])/(1-SOC_V[t_{P1}])$" when the current flowing to the battery part 31 after the time $t_{P1}$ is a charge current. When the correction coefficient k is set using the equation for the discharge or the equation for the charge, a difference between $SOC_I$ and $SOC_V$ gradually decreases in the charge or discharge period after the time $t_{P1}$. Also, stepwise decrease of the difference falls under the concept of gradual decrease of the difference.

In this way, the SOC processing unit 103 related to the third application example sets the correction coefficient k on the basis of $SOC_I$ and $SOC_V$ in the non-energizing period, and makes the SOC calculation unit 101 estimate the remaining capacity based on the measured current value I and the correction coefficient k during the charge or the discharge of the battery part 31 thereafter. Thus, $SOC_I$ is gradually corrected to $SOC_V$ considered as the true value during the charge or the discharge of the battery part 31, so that the sudden change of $SOC_I (=SOC_{OUT})$ can be avoided.

Figure 17:
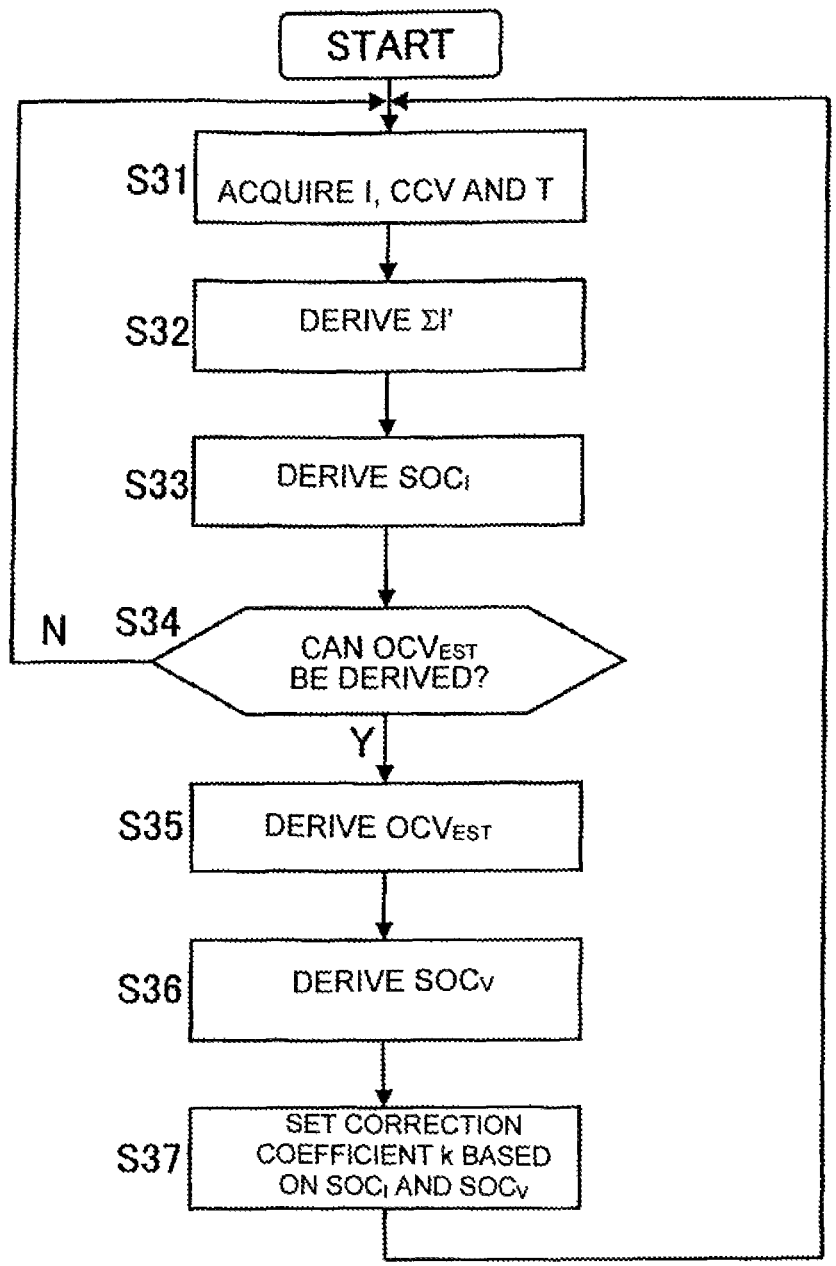
FIG. 17 is an operation flowchart of the remaining capacity estimation device related to the third application example.

With reference to FIG. 17, an operation procedure of the remaining capacity estimation device 100A will be described. The device 100A is capable of repeatedly executing a series of processing composed of steps S31-S34 or a series of processing composed of steps S31-S37 in a fixed cycle (a cycle of 1 millisecond, for instance). In step S31, the measured values I, CCV and T are acquired. The current integrated value $\Sigma I'$ is derived in following step S32, and $SOC_I$ is derived on the basis of the current integrated value $\Sigma I'$ in step S33 further. In following step S34, the device 100A determines whether or not it is possible to derive $OCV_{EST}$. Specifically, for instance, when the absolute value of the current value I is equal to or smaller than the threshold $I_{TH}$, it is determined that it is possible to derive $OCV_{EST}$ and the processing in steps S35-S37 is performed thereafter, and when the absolute value of the current value I is larger than the threshold $I_{TH}$, the processing returns to step S31. In steps S35 and S36, $OCV_{EST}$ is actually derived and $SOC_V$ is derived on the basis of the derived $OCV_{EST}$. In following step S37, the correction coefficient k is set (updated) on the basis of $SOC_I$ and $SOC_V$, and the processing returns to step S31. When the non-energizing period continues, the processing of steps S31-S37 can be repeatedly executed, and $OCV_{EST}$ or the like can be updated therein.

As described above, since a derivation expression of the correction coefficient k changes depending on the polarity of the current, actually, the correction coefficient k may be set in consideration of the current polarity after the charge or the discharge is restarted, after $SOC_V$ is derived.

Fourth Application Example

Figure 18:
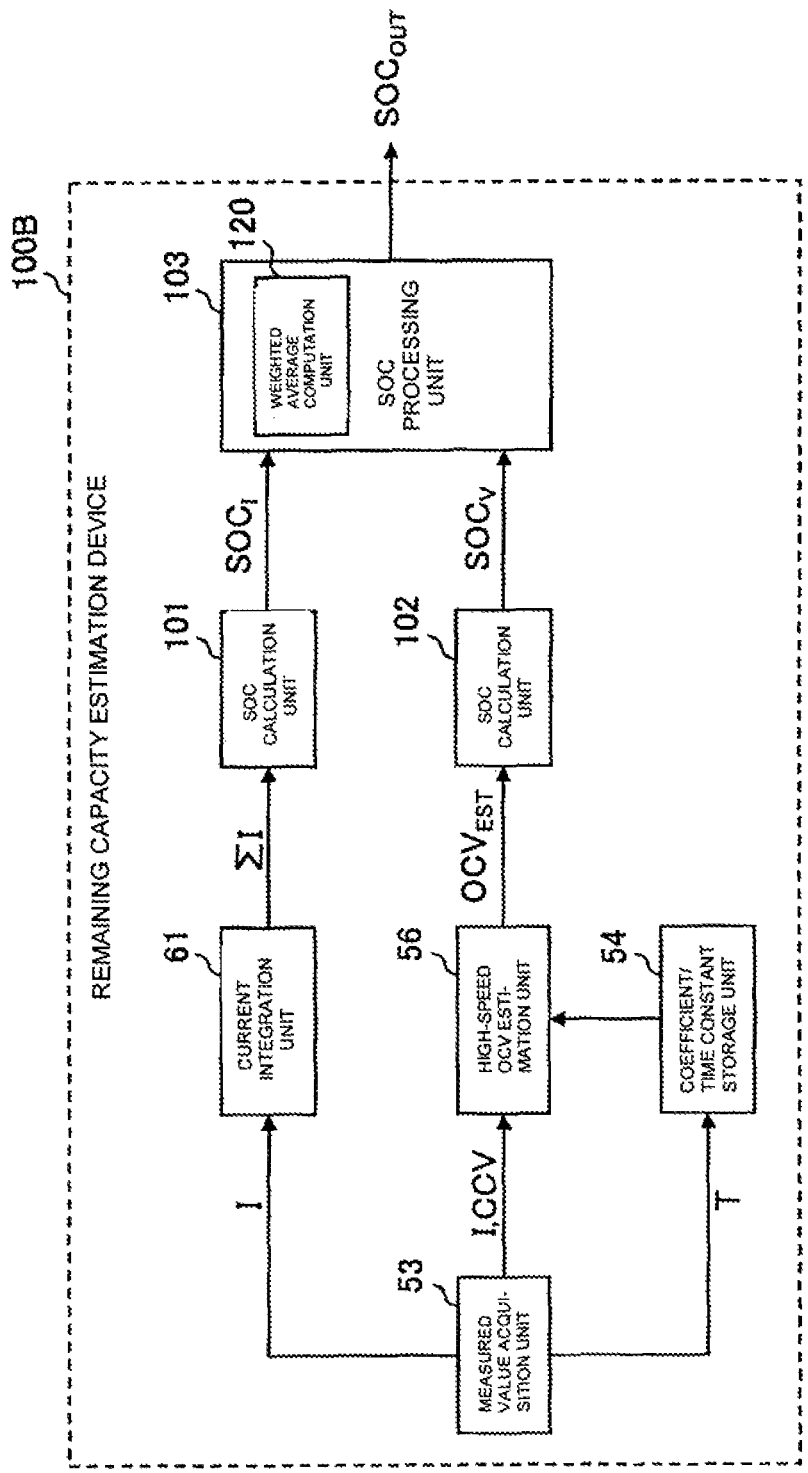
FIG. 18 is an internal block diagram of the remaining capacity estimation device related to a fourth application example.

A fourth application example will be described. FIG. 18 is an internal block diagram of a remaining capacity estimation device 100B which is one form of the remaining capacity estimation device 100. The remaining capacity estimation device 100B has the same configuration as the remaining capacity estimation device 100. However, the remaining capacity estimation device 100B includes a weighted average computation unit 120 inside the SOC processing unit 103. When $SOC_V$ is derived by the SOC calculation unit 102 in the non-energizing period, the weighted average computation unit 120 generates $SOC_{OUT}$ by taking the weighted average of $SOC_V$ and $SOC_I$ after the derivation. The SOC processing unit 103 is capable of outputting $SOC_I$ as $SOC_{OUT}$ in the energizing period.

Figure 19:
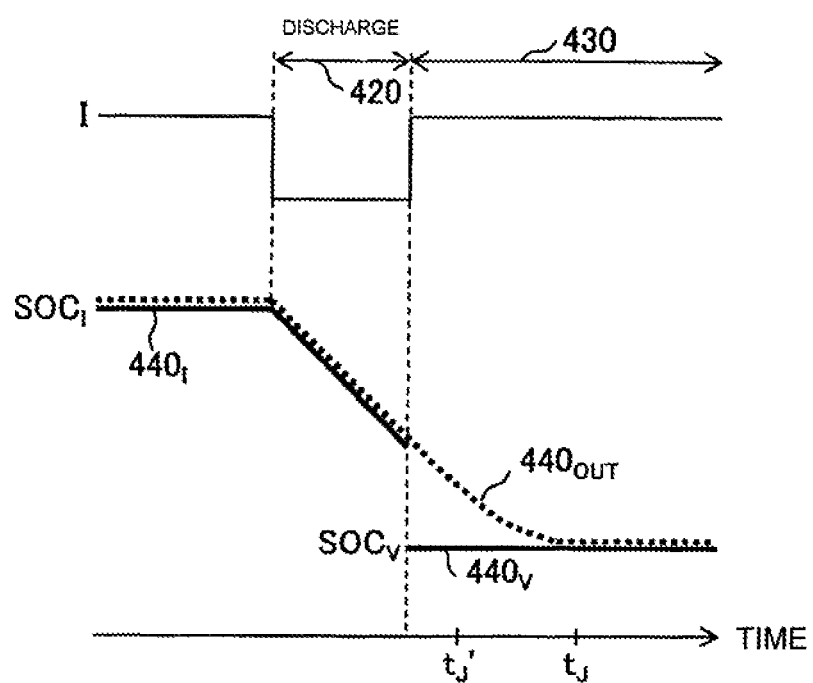
FIG. 19 is a diagram for describing a weighted average method of the SOC related to the fourth application example.

With reference to FIG. 19, a concrete example of the weighted average will be described. As illustrated in FIG. 19, it is assumed that the discharge of the battery part 31 is performed in a certain period 420 (for instance, the period P1), and open-circuit voltage value estimation, that is, the derivation of $OCV_{EST}$, by the estimation unit 56 is performed in a non-energizing period 430 (for instance, the period P2) after the discharge period 420. In FIG. 19, a solid line waveform 440$_I$ indicates the time transition of $SOC_I$ to the point in time of the end of the discharge period 420, and a solid line waveform 440$_V$ indicates the time transition of $SOC_V$ in the non-energizing period 430. Here, for the simplification of the description, it is considered that the estimated value $OCV_{EST}$ is invariable in the non-energizing period 430, and as a result, $SOC_V$ based on $OCV_{EST}$ is also invariable in the non-energizing period 430. A broken line waveform 440$_{OUT}$ indicates the time transition of the output data $SOC_{OUT}$ of the SOC processing unit 103.

As illustrated in FIG. 19, in a period to the end time of the discharge period 420 including the whole discharge period 420, the SOC processing unit 103 can output $SOC_I$ as $SOC_{OUT}$ as it is. After the end of the discharge period 420, when $OCV_{EST}$ and $SOC_V$ are derived, in the non-energizing period 430, the SOC processing unit 103 outputs a weighted average value of $SOC_I$ and $SOC_K$ as $SOC_{OUT}$. The weighted average can be taken in the weighted average computation unit 120. The weighted average computation unit 120 takes the weighted average so that a contribution rate of $SOC_V$ to the output data $SOC_{OUT}$ increases as time passes.

That is, at the time t in the non-energizing period 430, the weighted average computation unit 120 obtains and outputs $SOC_V[t]$ according to a weighted average expression "$SOC_{OUT}[t]=(1-k_W)\times SOC_I[t]+k_W\times SOC_V[t]$", and at that time, sets 0 as the initial value of the coefficient $k_W$, and then increases the value of the coefficient $k_W$ from 0 to 1 gradually (stepwise, in other words) as the elapsed time from the start time of the non-energizing period 430 to the time t increases. Also, $SOC_I[t]$ in the weighted average expression coincides with $SOC_I$ derived at the end time of the discharge period 420.

When the value of the coefficient $k_W$ reaches 1 at the time $t_J$ in the non-energizing period 430, the SOC processing unit 130 substitutes $SOC_V[t_J]$ for $SOC_I[t_J]$. Thus, when the charge or the discharge is performed thereafter, the SOC calculation unit 101 restarts the estimation of the remaining capacity (derivation of $SOC_I$) using the integrated value $\Sigma I$ with $SOC_I[t_J]=SOC_V[t_J]$ as a reference, and the SOC processing unit 103 can output $SOC_I$ derived by the restart as $SOC_{OUT}$ in the energizing period.

Though it is different from the situation illustrated in FIG. 19, if the charge or the discharge is restarted at the time $t_J'$ before the value of the coefficient $k_W$ reaches 1, $SOC_{OUT}[t_J']$ at that point in time may be substituted for $SOC_I[t_J']$ to restart the derivation of the $SOC_I$. In this case, since a deviation remains between the $SOC_I$ and the $SOC_V$, it is desirable to derive the correction coefficient k based on the $SOC_{OUT}[t_j']$ (=$SOC_I[t_j']$) and the $SOC_V[t_j']$ according to the method described in the third application example and gradually decrease the deviation in the charge or discharge period. Also, while it is assumed that the period 420 is the discharge period, a similar weighted average is possible when the period 420 is the charge period as well.

In the fourth application example, when $SOC_{OUT}$ (=$SOC_I$) is shifted from the true value of the SOC in the energizing period, since $SOC_{OUT}$ is gradually corrected toward $SOC_V$ considered as the true value in the non-energizing period, the sudden change of $SOC_{OUT}$ can be avoided.

Figure 20:
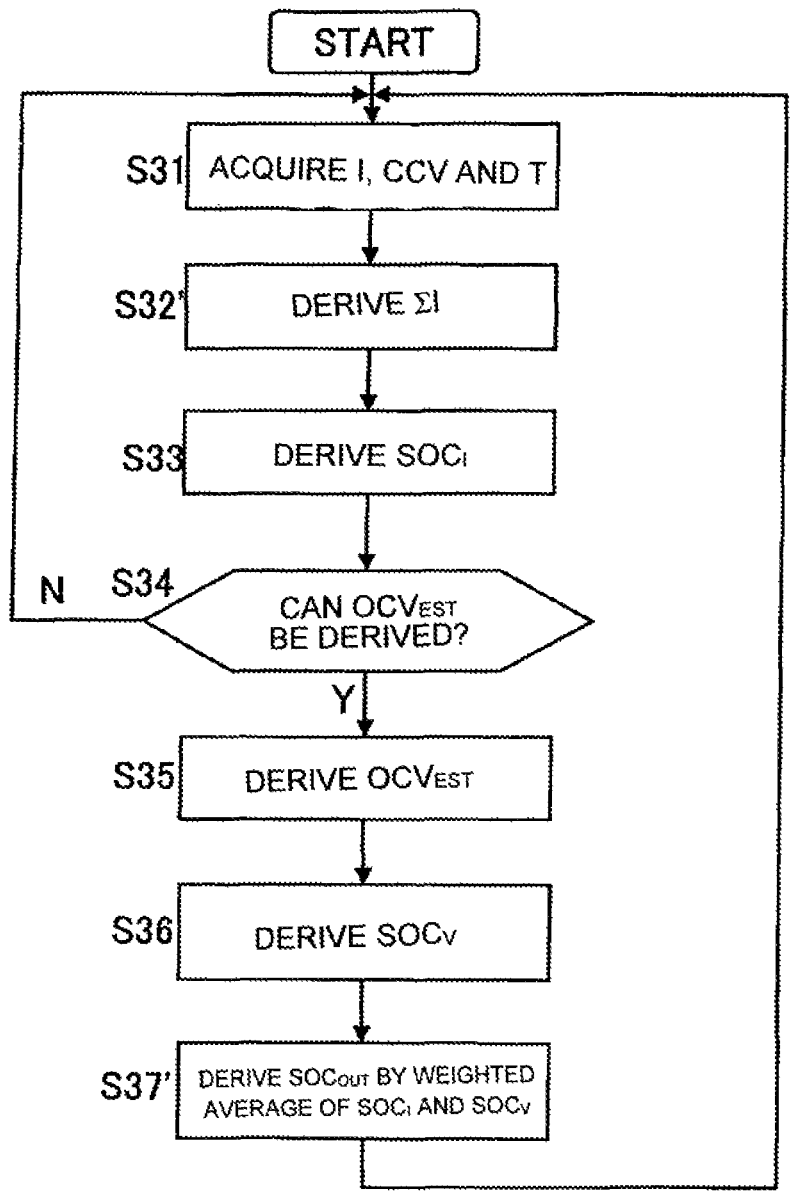
FIG. 20 is an operation flowchart of the remaining capacity estimation device related to the fourth application example.
Figure 21:
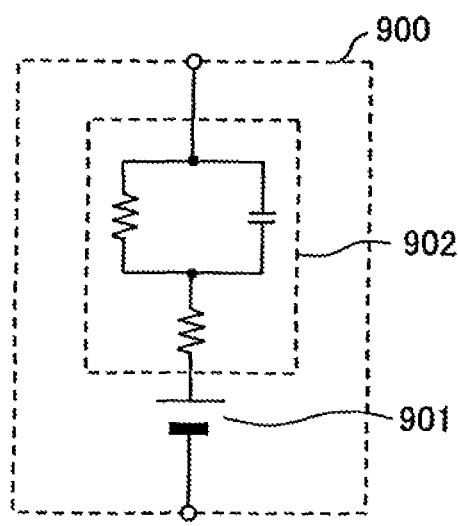
FIG. 21 is a diagram illustrating an example of the equivalent circuit of the battery part.

FIG. 20 is a flowchart illustrating an operation procedure of the remaining capacity estimation device 100B. Except for the point that the processing of steps S32 and S37 in FIG. 17 is replaced with steps S32' and S37', the operation procedure of the device 100B is the same as that of the device 100A described with reference to FIG. 17. $\Sigma I$ is derived in step S32', and $SOC_{OUT}$ is derived through the weighted average of $SOC_I$ and $SOC_V$ as described above in step S37'. However, when there is no difference between $SOC_I$ and $SOC_V$, the weighted average is not executed.

<<Modification or the Like>>

The embodiment of the present invention can be variously changed appropriately within the scope of technical ideas indicated within the scope of the claims. The above embodiment is only an example of the embodiment of the present invention, and the meanings of terms in the present invention and individual components are not limited to the ones described in the above embodiment. Concrete numerical values indicated in the above descriptions are just examples and they can be of course changed to various numerical values. As annotation matters applicable to the embodiment, annotation 1 to annotation 3 are described below. Contents described in the each annotation can be combined as long as there is no contradiction.

[Annotation 1]

Similarly to the open-circuit voltage estimation device 50 in FIG. 4, the full charge capacity estimation device 60 and the remaining capacity estimation device (100, 100A or 100B) described above can be provided in the unit control unit 32 or the battery management unit 21. The unit control unit 32 and the battery management unit 21 may cooperate to form the full charge capacity estimation device 60 and the remaining capacity estimation device (100, 100A or 100B).

[Annotation 2]

Each of the devices 50, 60, 100, 100A and 100B can be configured by hardware, or the combination of hardware and software. By describing all or some of the functions to be achieved in the device 50, 60, 100, 100A or 100B as a program, storing the program in a flash memory that can be loaded into the device 50, 60, 100, 100A or 100B, and executing the program on a program execution device (for instance, a microcomputer that can be loaded into the device 50, 60, 100, 100A or 100B), all or some of the functions may be achieved.

[Annotation 3]

For instance, the following consideration is feasible. Each of the devices 50, 60, 100, 100A and 100B is a kind of a battery state estimation device. It may be considered that an initial remaining voltage derivation unit that calculates $V_{DIFF}$ is provided inside the estimation unit 52 in FIG. 4. The current integration unit 61, the SOC calculation unit 101, the SOC calculation unit 102 and the SOC processing unit 103 may be respectively called a current amount derivation unit, a first remaining capacity estimation unit, a second remaining capacity estimation unit and a remaining capacity processing unit (see FIG. 9, FIG. 13, FIG. 14 and FIG. 18).

The invention claimed is:

1. A battery state estimation device comprising:
a measured value acquisition unit for acquiring a measured current value which is a measured value of a current flowing to a battery part and a measured voltage value which is a measured value of a terminal voltage of the battery part;
a first open-circuit voltage estimation unit for estimating an open-circuit voltage value of the battery part on the basis of the measured voltage value and the measured current value, or estimating the open-circuit voltage value of the battery part on the basis of a remaining capacity of the battery part estimated from an integrated value of the measured current value, in a first period during which charge or discharge of the battery part is performed; and
a second open-circuit voltage estimation unit for estimating the open-circuit voltage value of the battery part on the basis of the measured voltage value and an estimated open-circuit voltage value by the first open-circuit voltage estimation unit, in a second period during which the charge and discharge of the battery part are stopped, after the first period.

2. The battery state estimation device according to claim 1, wherein the second open-circuit voltage estimation unit includes an initial remaining voltage derivation unit for deriving, on the basis of the measured voltage value of the battery part at a specific time in the second period and the estimated open-circuit voltage value by the first open-circuit voltage estimation unit, an initial remaining voltage value which is a transient response component of a voltage remaining inside the battery part at the specific time, and estimates the open-circuit voltage value on the basis of the initial remaining voltage value, a predetermined time constant, and the measured voltage value in the second period.

3. The battery state estimation device according to claim 1, further comprising:
a current amount derivation unit for deriving a total current amount which has flowed to the battery part between two reference times when the charge and discharge of the battery part are stopped from an integration result of the measured current value between the two reference times; and
a full charge capacity estimation unit for estimating a full charge capacity of the battery part on the basis of the total current amount and the open-circuit voltage values of the battery part at the two reference times,
wherein at least one of the two open-circuit voltage values at the two reference times used in estimation in the full charge capacity estimation unit is the estimated open-circuit voltage value by the second open-circuit voltage estimation unit.

4. The battery state estimation device according to claim 1, further comprising:
a first remaining capacity estimation unit for deriving first estimated remaining capacity data by estimating the remaining capacity of the battery part through integration of the measured current value;
a second remaining capacity estimation unit for deriving second estimated remaining capacity data by estimating the remaining capacity of the battery part on the basis of the estimated open-circuit voltage value of the second open-circuit voltage estimation unit; and
a remaining capacity processing unit for correcting the first estimated remaining capacity data by using the second estimated remaining capacity data, or generating output data of the remaining capacity on the basis of the first and second estimated remaining capacity data.

5. The battery state estimation device according to claim 4, wherein the remaining capacity processing unit sets a correction coefficient on the basis of the first and second estimated remaining capacity data in the second period, and thereafter makes the first remaining capacity estimation unit estimate the remaining capacity using the measured current value and the correction coefficient.

6. The battery state estimation device according to claim 5, wherein the remaining capacity processing unit sets the correction coefficient such that a difference between the first and second estimated remaining capacity data gradually decreases during the charge or discharge of the battery part after the correction coefficient is set.

7. The battery state estimation device according to claim 4, wherein the remaining capacity processing unit generates the output data by taking a weighted average of the first and second estimated remaining capacity data in the second period.

8. The battery state estimation device according to claim 7, wherein the remaining capacity processing unit takes the weighted average such that a contribution rate of the second estimated remaining capacity data to the output data increases as time passes in the second period.

9. The battery state estimation device according to claim 4, wherein the remaining capacity processing unit substitutes the second estimated remaining capacity data for the first estimated remaining capacity data when the second estimated remaining capacity data is obtained in the second period.

\* \* \* \* \*